United States Patent
Chen et al.

(10) Patent No.: US 10,637,500 B2
(45) Date of Patent: Apr. 28, 2020

(54) APPARATUS AND METHOD FOR ACCELERATING MULTIPLICATION WITH NON-ZERO PACKETS IN ARTIFICIAL NEURON

(71) Applicant: British Cayman Islands Intelligo Technology Inc., Grand Cayman (KY)

(72) Inventors: Chi-Hao Chen, Zhubei (TW); Hong-Ching Chen, Zhubei (TW); Chun-Ming Huang, Zhubei (TW); Tsung-Liang Chen, Zhubei (TW)

(73) Assignee: BRITISH CAYMAN ISLANDS INTELLIGO TECHNOLOGY INC., Grand Cayman (KY)

( * ) Notice: Subject to any disclaimer, the term of this patent is extended or adjusted under 35 U.S.C. 154(b) by 77 days.

(21) Appl. No.: 16/153,474

(22) Filed: Oct. 5, 2018

(65) Prior Publication Data
US 2019/0115933 A1    Apr. 18, 2019

Related U.S. Application Data

(60) Provisional application No. 62/581,053, filed on Nov. 3, 2017, provisional application No. 62/571,297, filed on Oct. 12, 2017.

(51) Int. Cl.
*H03M 7/30* (2006.01)
*G06F 7/544* (2006.01)
(Continued)

(52) U.S. Cl.
CPC ........ *H03M 7/6047* (2013.01); *G06F 7/5443* (2013.01); *G06F 17/16* (2013.01); *G06N 3/04* (2013.01); *G06N 3/063* (2013.01); *H03K 19/20* (2013.01); *H03M 7/30* (2013.01); *H03M 7/3066* (2013.01)

(58) Field of Classification Search
None
See application file for complete search history.

(56) References Cited

U.S. PATENT DOCUMENTS

2008/0262990 A1* 10/2008 Kapoor ............... G06F 9/505
                                                    706/20
2011/0214157 A1*  9/2011 Korsunsky ........... H04L 63/20
                                                     726/1

(Continued)

*Primary Examiner* — Michael D. Yaary
(74) *Attorney, Agent, or Firm* — Muncy, Geissler, Olds & Lowe, P.C.

(57) ABSTRACT

An acceleration apparatus applied in an artificial neuron is disclosed. The acceleration apparatus comprises an AND gate array, a first storage device, a second storage device and a multiply-accumulate (MAC) circuit. The AND gate array with plural AND gates receives a first bitmap and a second bitmap to generate an output bitmap. The first storage device stores a first payload and outputs a corresponding non-zero first element according to a first access address associated with a result of comparing the first bitmap with the output bitmap. The second storage device stores a second payload and outputs a corresponding non-zero second element according to a second access address associated with a result of comparing the second bitmap with the output bitmap. The MAC circuit calculates a dot product of two element sequences from the first storage device and the second storage device.

47 Claims, 12 Drawing Sheets

(51) Int. Cl.
*G06N 3/04* (2006.01)
*H03K 19/20* (2006.01)
*G06F 17/16* (2006.01)
*G06N 3/063* (2006.01)

(56) References Cited

U.S. PATENT DOCUMENTS

2013/0325766 A1* 12/2013 Petre ............... G06N 3/049
 706/15
2014/0052679 A1* 2/2014 Sinyavskiy ........... G06N 3/10
 706/25
2014/0379624 A1* 12/2014 Piekniewski ........ G06N 3/049
 706/15
2019/0005377 A1* 1/2019 Malaya .............. G06N 3/0427
2019/0115933 A1* 4/2019 Chen ................ H03M 7/6047

* cited by examiner

APPARATUS AND METHOD FOR ACCELERATING MULTIPLICATION WITH NON-ZERO PACKETS IN ARTIFICIAL NEURON

CROSS-REFERENCE TO RELATED APPLICATION

This application claims priority under 35 USC 119(e) to U.S. provisional application No. 62/571,297, filed on Oct. 12, 2017, the content of which is incorporated herein by reference in its entirety. This application also claims priority under 35 USC 119(e) to U.S. provisional application No. 62/581,053, filed on Nov. 3, 2017, the content of which is incorporated herein by reference in its entirety.

BACKGROUND OF THE INVENTION

Field of the Invention

The invention relates to an integrated circuit, and more particularly, to an apparatus and method for accelerating multiplications with non-zero packets in an artificial neuron.

Description of the Related Art

An artificial neural network (ANN) is based on a collection of connected neurons. When processing and propagating input signals, the input values (hereinafter called "synapse values") supplied to the neuron's synapses are each modulated by the synapses' respective weight values. The effect of this process is to pass a portion of the synapse value through the synapse, which is proportional to the weight value. In this way, the weight value modulates the connection strength of the synapse. The result is then summed with the other similarly processed synapse values. Respective neurons receive the weighted input from the neuron in the previous stage and calculate the sum of the products. A propagation function for each neuron can be described mathematically as follows: $y = \sum_{i=0}^{N-1} w[i] * x[i]$, where y is the output value of a given neuron's propagation function, x[i] is the synapse value supplied/inputted to the neuron's synapse i, w[i] is the weight value for modulating the synapse value at the neuron's synapse i, and the total number of the neuron's synapses is N.

At present, neural networks are often executed by simulation software, using personal computers. However, as the size of the network increases, the software becomes more complex and the processing time increases. It is foreseeable that the operation of neurons could be performed by hardware, but as the number of inputs and the size of the memory increase, the cost and complexity of such hardware increases significantly. In practice, when a neural network is realized in the form of an integrated circuit, two shortcomings of the above propagation function are the requirements for numerous memory size for the weight values and the synapse values and for numerous multipliers which perform the multiplication operations between the synapse values and the weight values. FIG. 1A is an example showing thirty-two weight values $W_0 \sim W_{31}$ are multiplied by thirty-two synapse values $X_0 \sim X_{31}$ using thirty-two multipliers in a conventional artificial neuron. Referring to the example of FIG. 1A, assuming the propagation function is computed directly, N=32 and the bit length for each weight value ($W_0 \sim W_{31}$) and each synapse value ($X_0 \sim X_{31}$) is 16-bit, the memory size for the weight values $W_0 \sim W_{31}$ and the synapse values $X_0 \sim X_{31}$ is 1024(=(32+32)*16) bits and the number of multipliers 10 is 32. The multipliers 10 are often large and complex taking significant portions of the available integrated circuit area, especially for the neurons that process large synapses since each synapse value is typically matched with a dedicated multiplier.

In machine learning, the weight values in a weight matrix W normally becomes sparse after L1-regularization or network pruning. A matrix is called sparse when it contains a small amount of non-zero elements. Conventionally, zero-skipping is only applied to the weight values for accelerating the computation of the above propagation function as shown in FIG. 1B. FIG. 1B is a diagram showing non-zero weight values are multiplied by corresponding synapse values based on the example in FIG. 1A after zero-skipping is applied to the weight matrix W. Referring to FIG. 1B, since the zero weight values are skipped, the memory size for the weight matrix W and the data matrix X is 752(=(15+32)*16) bits and the number of multipliers 10 is 15. In comparison with FIG. 1A, the memory size for the weight matrix W and the computational overhead are reduced in FIG. 1B.

Hence, it is desirable to further reduce the number of multipliers (or multiplication operations) from neural networks as much as possible. Yet, it is still desirable to further reduce the memory size for the weight and the data matrices and the computational overhead, thereby allowing more neurons per unit area on the integrated circuit and processing at high speed and with low power consumption.

SUMMARY OF THE INVENTION

In view of the above-mentioned problems, an object of the invention is to provide an acceleration apparatus to reduce the computational overhead and the memory size for both of the weight values and the synapse values.

One embodiment of the invention provides an acceleration apparatus applied in an artificial neuron. The apparatus comprises an AND gate array, a first storage device, a second storage device and a multiply-accumulate (MAC) circuit. The AND gate array with plural AND gates receives a first bitmap and a second bitmap to generate an output bitmap. The first storage device sequentially stores a first payload comprising M1 non-zero first elements and outputs a corresponding non-zero first element according to a first access address associated with a result of comparing the first bitmap with the output bitmap. The second storage device sequentially stores a second payload comprising M2 non-zero second elements and outputs a corresponding non-zero second element according to a second access address associated with a result of comparing the second bitmap with the output bitmap. The MAC circuit generates a product of the corresponding non-zero first element and the corresponding non-zero second element, and generates an accumulation value based on the product and at least one previous accumulate value. The first bitmap contains location information for the M1 non-zero first elements in the first payload, and the second bitmap contains location information for the M2 non-zero second elements in the second payload. Another embodiment of the invention provides an acceleration method applied in an artificial neuron. The acceleration method comprises: performing a bitwise logical AND operation between a first bitmap and a second bitmap to generate an output bitmap; sequentially storing a first payload comprising M1 non-zero first elements in a first storage device and a second payload comprising M2 non-zero second elements in a second storage device; outputting a corresponding non-zero first element by the first storage device according to a first access address associated with a result of comparing the first bitmap with the output bitmap and outputting a corresponding non-zero second element by the second storage device according to a second access address associated with a result of comparing the second bitmap with the output bitmap; calculating and accumulating a product of the corresponding non-zero first element and the corresponding non-zero second element; and, repeating the steps of outputting and calculating and accumulating until non-zero bits in the output bitmap is processed to obtain an accumulation value. The first bitmap contains location information for the M1 non-zero first elements in the first payload, and the second bitmap contains location information for the M2 non-zero second elements in the second payload.

Another embodiment of the invention provides an acceleration apparatus applied in an artificial neuron. The apparatus comprises an AND gate array, a first storage device, a second storage device and a calculation circuit. The AND gate array with plural AND gates receives a first bitmap and one of P1 bitmap to generate an output bitmap. The first storage device sequentially stores a first payload comprising M1 non-zero first elements and outputs a corresponding non-zero first element according to a first access address associated with a result of comparing the first bitmap with the output bitmap. The calculation circuit calculates and accumulates a product according to one of P1 different group values and a sum of the outputs from the first storage device for each of the P1 bitmaps to generate an accumulation value. The first bitmap contains location information for the M1 non-zero first elements in the first payload. The P1 bitmaps respectively operate in conjunction with the P1 different group values.

Another embodiment of the invention provides an acceleration method applied in an artificial neuron. The acceleration method comprises: sequentially storing a first payload comprising M1 non-zero first elements in a first storage device; performing a bitwise logical AND operation between a first bitmap and one of P1 bitmaps to generate an output bitmap; outputting each corresponding non-zero first element by the first storage device according to each first access address associated with a result of comparing the first bitmap with the output bitmap; calculating a product according to one of P1 different group values and a sum of the outputs from the first storage device for each of the P1 bitmaps; accumulating the product; and repeating the steps of performing, outputting, calculating and accumulating until the P1 bitmaps are processed to generate an accumulation value. The first bitmap contains location information for the M1 non-zero first elements in the first payload. The P1 bitmaps respectively operate in conjunction with the P1 different group values.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

As used herein and in the claims, the term "and/or" includes any and all combinations of one or more of the associated listed items. The use of the terms "a" and "an" and "the" and similar referents in the context of describing the invention are to be construed to cover both the singular and the plural, unless otherwise indicated herein or clearly contradicted by context.

A feature of the invention is to provide none-zero packets (NZPs) for a weight matrix W (comprising a plurality of weight values) and a data matrix X (comprising a plurality of synapse values) to accelerate the computation of the above propagation function in an artificial neuron, thereby reducing the computational overhead and the memory size for the weight matrix W and the data matrix X. The format of the NZPs provides a high compression rate for the weight matrix W and the data matrix X, and enables a direct addressing mechanism that allows random access to the NZPs in a compressed form without decompressing the NZPs, which is hereinafter called execution-in-compression (XIC) in this specification. The XIC feature eliminates decompression latency and a buffer for indirect access of decompression. Another feature of the invention is to perform a bitwise logical AND operation on two bitmap headers of two NZPs for the weight matrix W and the data matrix X to instantly determine NZ element pairs to be retrieved and then multiplied together, thus increasing processing efficiency.

Figure 1A:
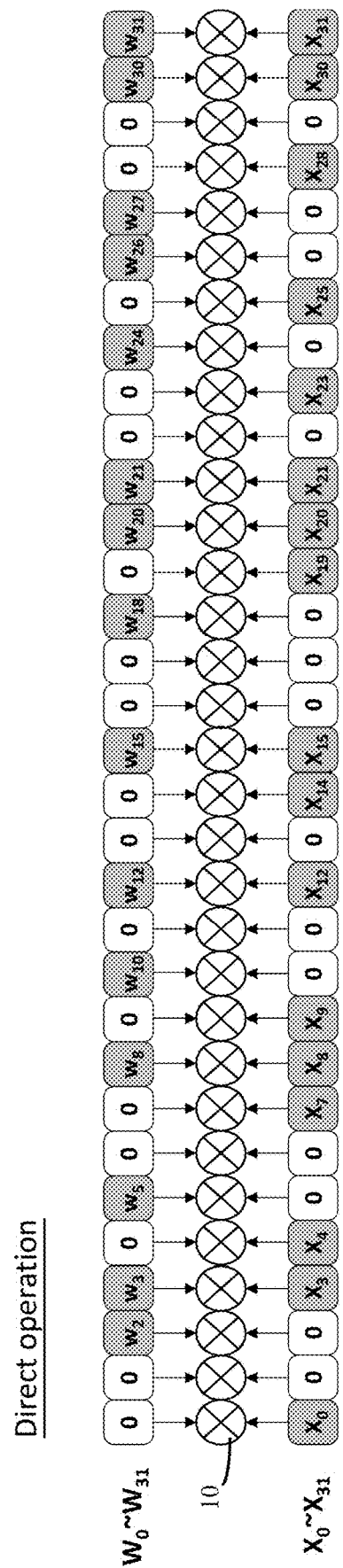
FIG. 1A is an example showing thirty-two weight values $W_0 \sim W_{31}$ are multiplied by thirty-two synapse values $X_0 \sim X_{31}$ using thirty-two multipliers in a conventional artificial neuron.
Figure 1B:
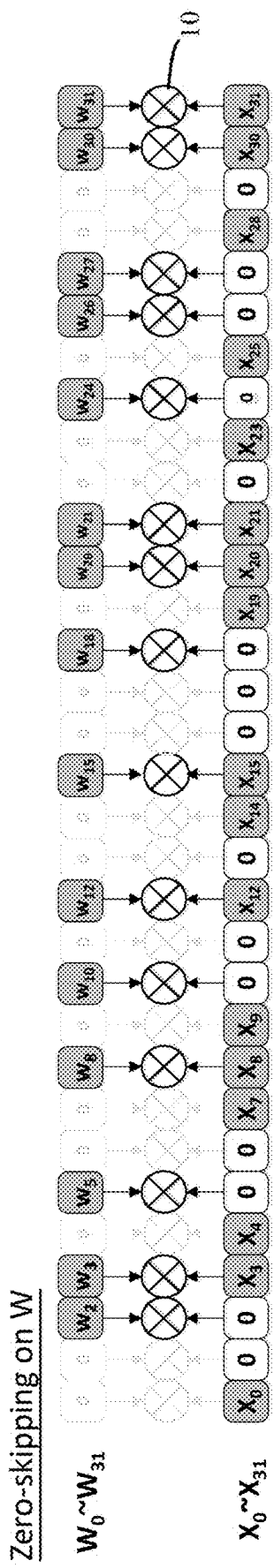
FIG. 1B is a diagram showing non-zero weight values are multiplied by corresponding synapse values based on the example in FIG. 1A after zero-skipping is applied to the weight matrix W.
Figure 2:
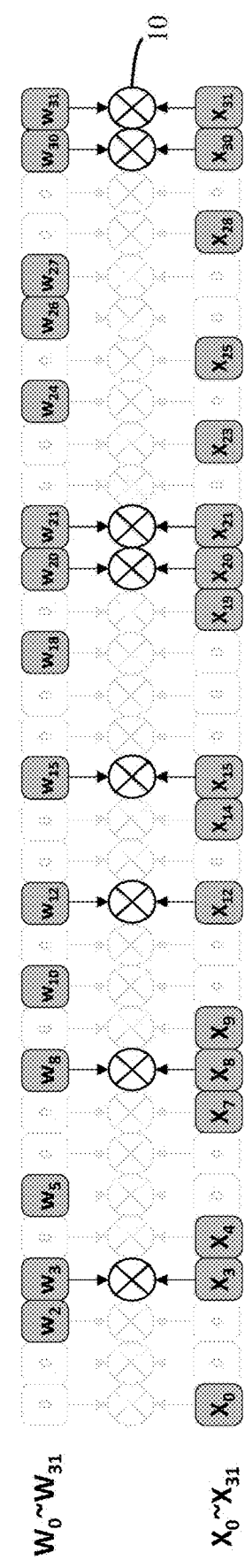
FIG. 2 is a diagram showing the multiplications of non-zero weight values and corresponding non-zero synapse values based on the example in FIG. 1A after zero-skipping is applied to matrices W and X according to the invention.

Some activation functions, such as rectified linear unit (ReLU), lead to the data sparsity in the data matrix X. In a case that both of the weight matrix W and the data matrix X are sparse, zero-skipping is applied to both of the weight matrix W and the data matrix X as shown in FIG. 2. FIG. 2 is a diagram showing the multiplications of non-zero weight values and corresponding non-zero synapse values based on the example in FIG. 1A after zero-skipping is applied to matrices W and X. Referring to FIG. 2, since the zero weight values and the zero synapse values are skipped, the memory size for the weight matrix W and the data matrix X is 512(=(15+15)*16) bits and the number of multipliers 10 is 8. Obviously, in comparison with FIGS. 1A and 1B, the computational overhead and the memory size for both of the weight matrix W and the data matrix X are further reduced after zero-skipping is applied to matrices W and X in FIG. 2.

Figure 3A:
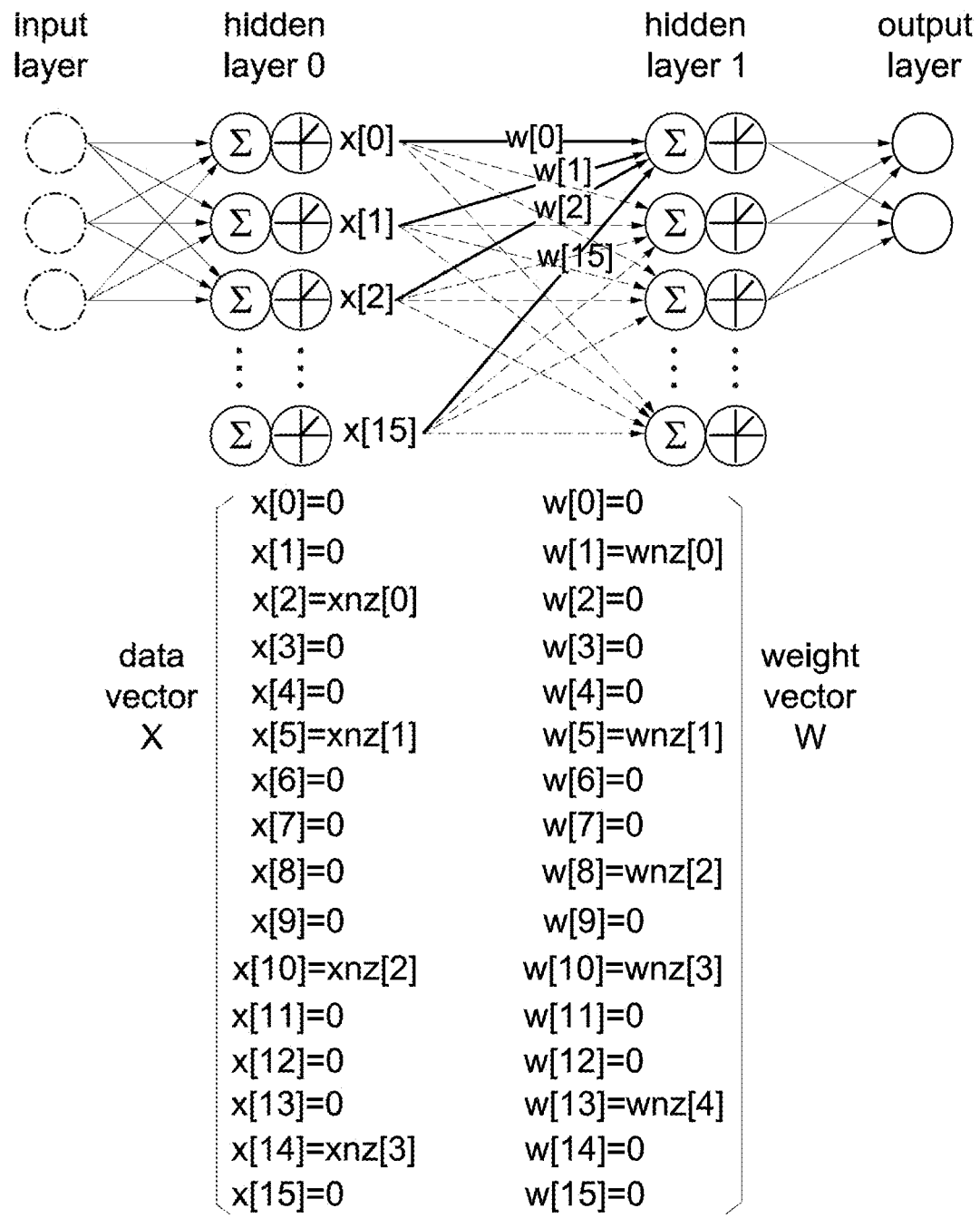
FIG. 3A shows an exemplary DNN model comprising two hidden layers between the input and output layers.
Figure 3B:
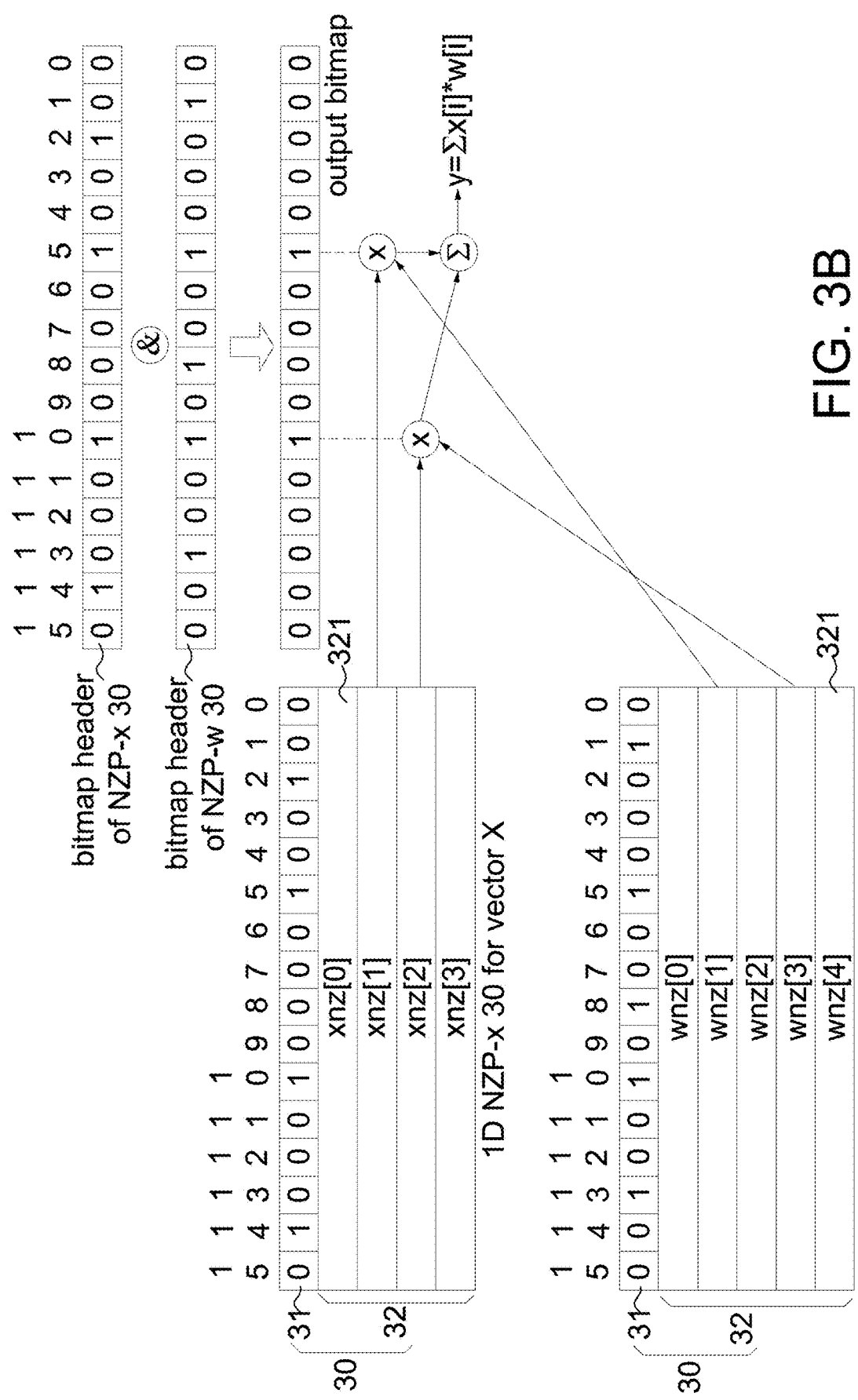
FIG. 3B is a diagram showing two NZPs for the weight vector W and the data vector X in FIG. 3A.

In view of the fact that the majority of elements in the weight matrix W and the data matrix X are zeros for DNN (deep neural network), the invention provides the NZPs that discard zeros and focus on non-zero (NZ) elements for the weight matrix W and the data matrix X. FIG. 3A shows an exemplary DNN model comprising two hidden layers between the input and output layers, where N=16, x[i] is the output of a previous layer, w[i] is the weight value for modulating the synapse value at the neuron's synapse i, xnz[j] is an ordered non-zero synapse value and wnz[j] is an ordered non-zero weight value, for i=0~15, 0=<j<=15. Please note that the size (16×1) of the matrices W/X in FIG. 3A is provided by way of explanation and not limitations of the invention. In the example of FIG. 3A, each of the matrices W and X has only one column, usually called a column vector. FIG. 3B is a diagram showing two 1D NZPs for the weight vector W and the data vector X in FIG. 3A. Referring to FIG. 3B, each 1D NZP 30 includes a bitmap header 31 and a payload 32. Since N=16, the bitmap header 31 is a bitmap representing the sixteen elements (i.e., synapse values/weight values) in the vector X/W. Specifically, each bit of the bitmap header 31 represents a corresponding element in the vector X/W. In one embodiment, if an element in the vector X/W is equal to 0, its corresponding bit in the bitmap header 31 is set to 0; otherwise, if the element has a value not equal to 0, its corresponding bit in the bitmap header 31 is set to 1. Non-zero elements are stored in order in the payload 32 while zero elements are discarded in the payload 32. The bitmap header 31 and each non-zero element in the payload 32 have a fixed size, such as 16-bit in the examples of FIG. 3B. In this manner, the weight vector W and the data vector X are respectively compressed into the 1D NZP-w 30 and the 1D NZP-x 30.

Referring to the right side of FIG. 3B, a bitwise logical AND operation is performed between the bitmap headers 31 of the 1D NZP-w 30 and the 1D NZP-x 30 to produce an output bitmap. Since there are two non-zero bits in the output bitmap (bm-o), two NZ element pairs (a first pair: xnz[1] and wnz[1]; a second pair: xnz[2] and wnz[3]) are instantly determined to be retrieved and then the multiply-accumulate (MAC) operations are performed over the two NZ element pairs to obtain its result, i.e., y=xnz[1]*wnz[1]+xnz[2]*wnz[3].

Figure 4A:
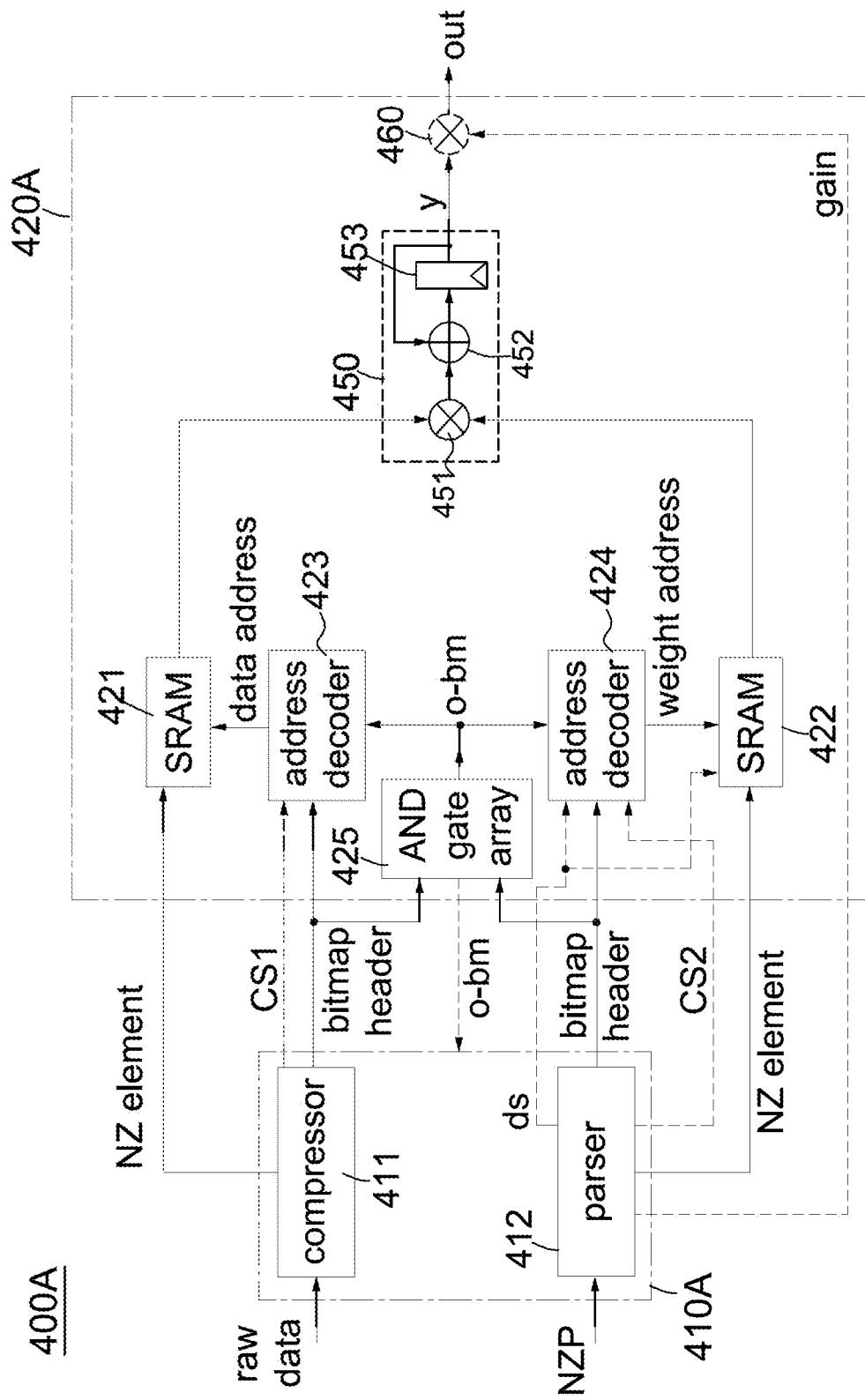
FIG. 4A is a block diagram of acceleration apparatus according to one embodiment of the invention.

FIG. 4A is a block diagram of acceleration apparatus according to one embodiment of the invention. Referring to FIG. 4A, an acceleration apparatus 400A of the invention includes a front-end module 410A and a NZ packet engine 420A. The acceleration apparatus 400A of the invention, applied to an artificial neuron, is used to perform sparse vector by sparse vector multiplication (e.g., FIGS. 3A-3B) or sparse matrix by sparse matrix multiplication (e.g., FIGS. 5A-5B). The front-end module 410A includes a compressor 411 and a parser 412. The NZ packet engine 420A includes two SRAMs 421 and 422, two address decoders 423 and 424, a AND gate array 425 and a multiplier-accumulator (MAC) 450. The multiplier 460 is an optional device and therefore represented in dash line. The number of the AND gates included in the AND gate array 425 depends on the number of bits in the bitmap header 31 of a 1D NZP or the the number of bits in the bitmap header 51 of 2D NZP-w for filter 53 (see the descriptions for FIGS. 5A-5B). Due to the bitmap header 31 having sixteen bits in the examples of FIG. 3B, the AND gate array 425 includes sixteen AND gates connected in parallel. The MAC 450 is implemented using a multiplier 451, an adder 452 and an accumulator 453. The front-end module 410A including the compressor 411 and the parser 412 is only utilized as embodiments and not limitations of the invention. In the actual implementations, the compressor 411 and the parser 412 can be swapped or replaced with two compressors or two parsers in the front-end module 410A. Throughout the specification, the same components with the same function are designated with the same reference numerals.

The operations of the acceleration apparatus 400A are described with reference to the examples in FIGS. 3A-3B. For the examples in FIGS. 3A-3B, the acceleration apparatus 400A of the invention is used to calculate a dot product of the data vector X and the weight vector W. At first, the compressor 411 receives raw data (x[0]~x[15]) for the data vector X, compresses the raw data into a bitmap header 31 and a payload 32 with four NZ elements 321 (xnz[0]~xnz [3]) of NZP-x 30 for the data vector X, supplies the bitmap header 31 to the address decoder 423 and the AND gate array 425, and supplies the payload 32 to the SRAM 421. The parser 412 receives the 1D NZP-w 30, parses the NZP-w 30 to divide the NZP-w 30 into its bitmap header 31 and its payload 32 with five NZ elements (wnz(0)~wnz(4)), supplies the bitmap header 31 to the address decoder 424 and the AND gate array 425, and supplies its payload 32 to the SRAM 422. The SRAM 421 sequentially stores the four NZ elements (xnz(0)~xnz(3)) from a base-address b-addr1 while the SRAM 422 sequentially stores the five NZ elements (wnz(0)~wnz(4)) from a base-address b-addr2.

Prior to element-by-element multiplications of the two vectors X and W, the AND gate array 425 performs a bitwise logical AND operation between the bitmap headers 31 of the NZP-w 30 and the NZP-x 30 in parallel to generate the output bitmap (i.e., o-bm) with two non-zero bits (i.e., bit 5 and bit 10). Next, according to o-bm and the bitmap header 31 of the NZP-x 30, the address decoder 423 sequentially calculates two data offsets (i.e., 0x2 and 0x4) for two NZ elements (xnz[1] and xnz[2]) and respectively adds the two data offsets and the base-address b-addr1 in SRAM 421 to output two data addresses (i.e., 0x2+b-addr1 and 0x4 b-addr1); according to o-bm and the bitmap header 31 of the NZP-w 30, the address decoder 424 sequentially calculates two weight offsets (i.e., 0x2 and 0x6) of two NZ elements (wnz[1] and wnz[3]) and respectively adds the two weight offset and the base-address b-addr2 in SRAM 422 to output two weight addresses (i.e., 0x2+b-addr2 and 0x6 b-addr2). The SRAM 421 sequentially outputs their corresponding NZ elements (i.e., synapse values) to the MAC 450 based on the two data addresses (0x2+b-addr1 and 0x4+b-addr1) while the SRAM 422 sequentially outputs their corresponding NZ elements (i.e., weight values) to the MAC 450 based on the two weight addresses (0x2+b-addr2 and 0x6+b-addr2). According to the outputs of the SRAMs 421 and 422, the MAC 450 sequentially generates a product of the NZ weight value wnz[1] and the NZ synapse value xnz[1] for the first non-zero bit in o-bm and a product of the NZ weight value wnz[3] and the NZ synapse value xnz[2] for the second non-zero bit in o-bm, and sequentially adds the products to the accumulator 453 to produce an accumulate value, i.e., y=xnz[1]*wnz[1]+xnz[2]*wnz[3]. Please note that in this embodiment, assuming the parser 412 sets a gain to 1 and sends the gain to the multiplier 460, thus out=y.

According to o-bm, the NZ packet engine 420A only performs MAC operations over the corresponding NZ elements in vectors X and W, which maximizes the throughput and energy efficiency. Since the 1D NZP 30 has fixed-size NZ elements, the data/weight offset/address can be used to directly access a specified NZ element in the SRAM 421/422 by comparing o-bm and the bitmap header 31 of the 1D NZP 30 (called "directly addressable mechanism"), without decompressing the 1D NZP 30. This "directly addressable mechanism" enables random access to the SRAM 421/422 for the specified element of the 1D NZP 30 (called "the XIC feature"). The XIC feature reduces the additional computation for decompression, minimizes memory operation and data delivery during computation and speeds up the throughput for large matrix calculation, especially for DNN.

Figure 5A:
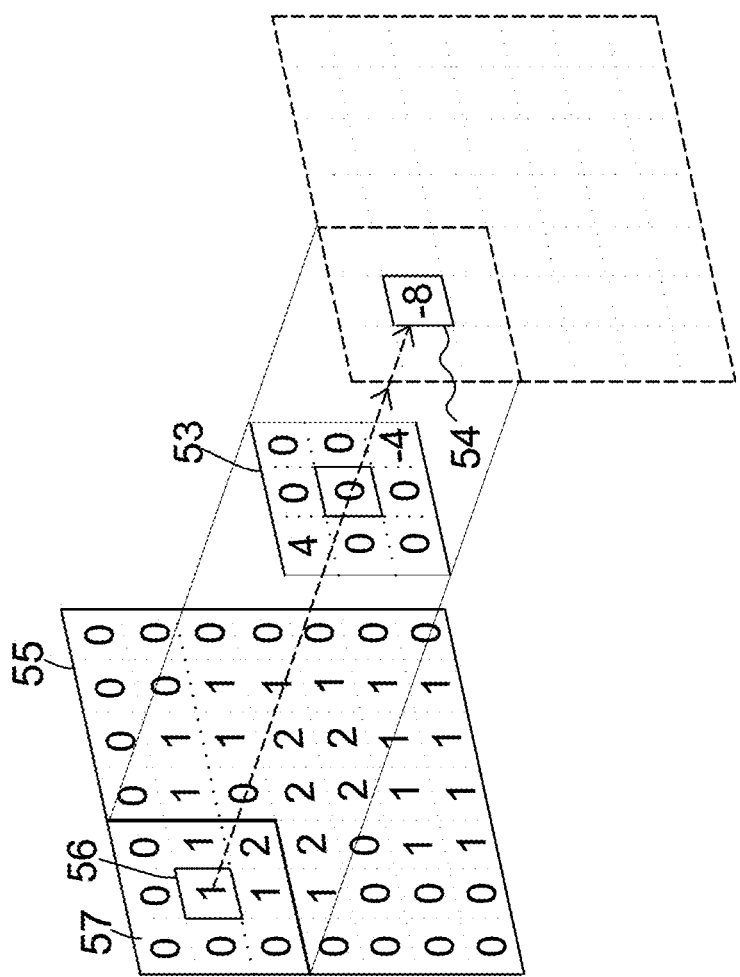
FIG. 5A is an example showing an input image 55 and a filter 53 for use in a CNN model.

With the format of the NZP and its "directly addressable mechanism", the NZP and the acceleration apparatus 400A are also applicable to two dimensional data matrix X and weight matrix W. In other words, the NZP and the acceleration apparatus 400A can also operate well with convolutional neural network (CNN). FIG. 5A is an example showing an input image 55 and a filter 53 for use in a CNN model. Referring to FIG. 5A, the input image 55 (corresponding to a data matrix X) is a 7×7 array of pixel values (or synapse values) and the filter 53 (corresponding to a weight matrix W) is 3×3 array of weights values. The filter 53 is sometimes referred to as a kernel. The top left corner (i.e., a receptive field 57 having a 3×3 window) of the input image 55 is the first position for the filter 53 to be applied to. Center element of the filter 53 is placed over the source pixel 56. The source pixel 56 is then defined as a destination pixel 54 after the source pixel 56 is replaced with a sum of the products of corresponding pixel values in the receptive field 57 and corresponding weight values in the filter 53. Stated in another way, the weights values in the filter 53 are multiplied element-by-element by the corresponding pixel values in the receptive field 57 (i.e., computing element-wise multiplications) and then the nine products are all summed up to produce a new value (i.e., −8) of the destination pixel 54 representative of when the filter 53 is at the top left of the input image 55. The above calculation is performed for every location on the input image 55. Next, the filter 53 is moved to the right by one pixel, then right again by one pixel, and so on. Every unique location on the input image 55 produces a number. After the filter 53 slides over all the locations of the input image 55, a 5×5 array of numbers (called an activation map or feature map) is produced.

Figure 5B:
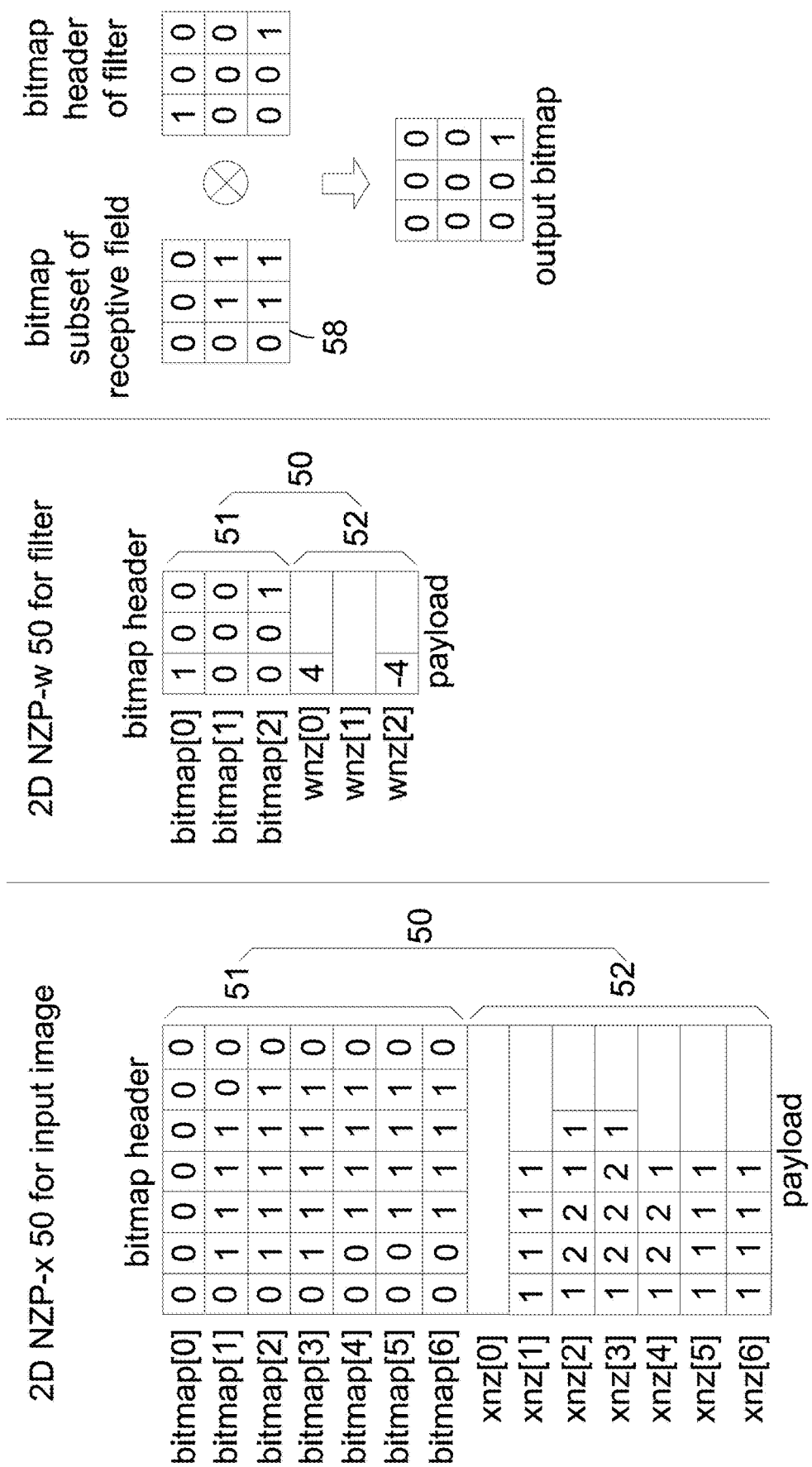
FIG. 5B is a diagram showing two NZPs for the input image 55 and the filter 53 in FIG. 5A.

FIG. 5B is a diagram showing two 2D NZPs for the input image 55 and the filter 53 in FIG. 5A. Referring to FIG. 5B, each 2D NZP 50 includes a bitmap header 51 and a payload 52. Since the input image 55 is a 7×7 array, the bitmap header 51 of the 2D NZP-x 50 is a 2D bitmap representing the forty-nine pixel values in the input image 55. Since the filter 53 is a 3×3 array, the header 51 of the 2D NZP-w 50 is a 2D bitmap representing the nine weight values in the filter 53. Similar to the example in FIG. 3B, each bit of the bitmap header 51 represents a corresponding element in the input image 55 or the filter 53. In one embodiment, if an element in the input image 55 or the filter 53 has a value of 0, its corresponding bit in the bitmap header 51 is set to 0; otherwise, its corresponding bit in the bitmap header is set to 1. Non-zero elements are stored in order in the payload 52 while zero elements are discarded. Please note that in the examples of FIGS. 5A-5B, the bitmap headers 51 and each non-zero element in the payloads 52 of 2D NZP-x 50 and 2D NZP-w 50 have different fixed sizes, such as 49-bit for the bitmap header 51 of 2D NZP-x 50, 9-bit for the bitmap header 51 of 2D NZP-w 50 and 16-bit for each NZ element in the payloads 52 of 2D NZP-x 50 and 2D NZP-w 50. In this manner, the input image 55 and the filter 53 are compressed into the 2D NZP-x 50 and the 2D NZP-w 50.

The operations of the acceleration apparatus 400A are described with reference to the examples in FIGS. 5A-5B. For the examples in FIGS. 5A-5B, the acceleration apparatus 400A of the invention is used to calculate all values in a feature map, and each value in the feature map is the sum of element-wise multiplications of the filter 53 and a corresponding receptive field 57 in the input image 55; the compressor 411 is configured to compress a 2D input image 55 into its bitmap header 51 and its payload 52; the parser 412 is configured to parse a 2D NZP-w 50 to divide the 2D NZP-w 50 into its bitmap header 51 and its payload 52. At first, the compressor 411 receives raw data of the 2D input image 55, compresses the 2D input image 55 into its bitmap header 51 and its payload 52 (including twenty-six NZ elements (xnz[1][0]~xnz[6][3]), and supplies its payload 52 to the SRAM 421. Please note that the compressor 411 supplies one bitmap subset 58 associated with its corresponding receptive field to the address decoder 423 and the AND gate array 425 at a time. The parser 412 receives the NZP-w 50, parses the NZP-w 50 to divide the NZP-w 50 into its header 51 and its payload 52 (including two NZ elements (wnz[0][0] and wnz[2][0]), supplies the bitmap header 51 to the address decoder 424 and the AND gate array 425, and then supplies the payload 52 to the SRAM 422. According to the locations of the NZ elements in the payload 52 of 2D NZP-x 50, the SRAM 421 sequentially stores the twenty-six NZ elements (xnz[1][0]~xnz[6][3]) relative to the base address (or start address) b-addr1[k] for each row of the payload 52, for k=0~6. For example, the NZ elements xnz[1] in the first row of the payload 52 are sequentially stored from the base address b-addr1[1] while the NZ elements xnz[2] in the second row of the payload 52 are sequentially stored from the base address b-addr2[2] in the SRAM 421. Thus, the address decoder 423 needs to maintain the base addresses b-addr1[k] for each row of the payload 52 of the 2D NZP-x 50. Likewise, according to the locations of the NZ elements in the payload 52 of 2D NZP-x 50, the SRAM 422 sequentially stores the two NZ elements (wnz[0][0] and wnz[2][0]) relative to the base address b-addr2[k] for each row of its payload 52, for k=0~2. Thus, the address decoder 424 needs to maintain the base addresses b-addr2[k] for each row of the payload 52 of the 2D NZP-w 50.

Please note that the AND gate array 425 includes nine AND gates connected in parallel to comply with the bitmap header 51 of the NZP-w 50 having nine bits in the example of FIG. 5B. Afterwards, prior to element wise multiplications of the receptive field 57 of the input image 55 and the filter 53, the AND gate array 425 performs a bitwise logical AND operation between the bitmap subset 58 of the receptive field 57 and the bitmap header 51 of the NZP-w in parallel to generate the output bitmap (i.e., o-bm) with one non-zero bit as shown in the right side of FIG. 5B.

Next, according to o-bm and the bitmap subset 58, the address decoder 423 calculates one data offset (i.e., 0x2) for the NZ element (xnz[2][1], located at $2^{nd}$ row and $1^{st}$ column in the payload 52 of 2D NZP-x 50) and adds the data offset and its base-address b-addr1[2] in SRAM 421 to obtain a data address (i.e., 0x2+b-addr1[2]); according to o-bm and the bitmap header 51 of the NZP-w 50, the address decoder 424 calculates a weight offset (i.e., 0x0) for the NZ element (wnz[2][0], located at $2^{nd}$ row and $0^{th}$ column in the payload 52 of 2D NZP-w 50) and adds the weight offset and the base-address b-addr2[2] in SRAM 422 to obtain a weight address (i.e., 0x0+b-addr2[2]). The SRAM 421 outputs the corresponding NZ element to the MAC 450 based on the data address (i.e., 0x2+b-addr1[2]) while the SRAM 422 outputs the corresponding NZ element to the MAC 450 based on the weight address (i.e., 0x0+b-addr2[2]). According to the outputs of the SRAMs 421 and 422, the MAC 450 generates a product of the NZ weight value wnz[2][2] and the NZ pixel value xnz[2][2] for the non-zero bit in o-bm, i.e., y=xnz[2][2]*wnz[2][2].

Figures 6A, 6B:
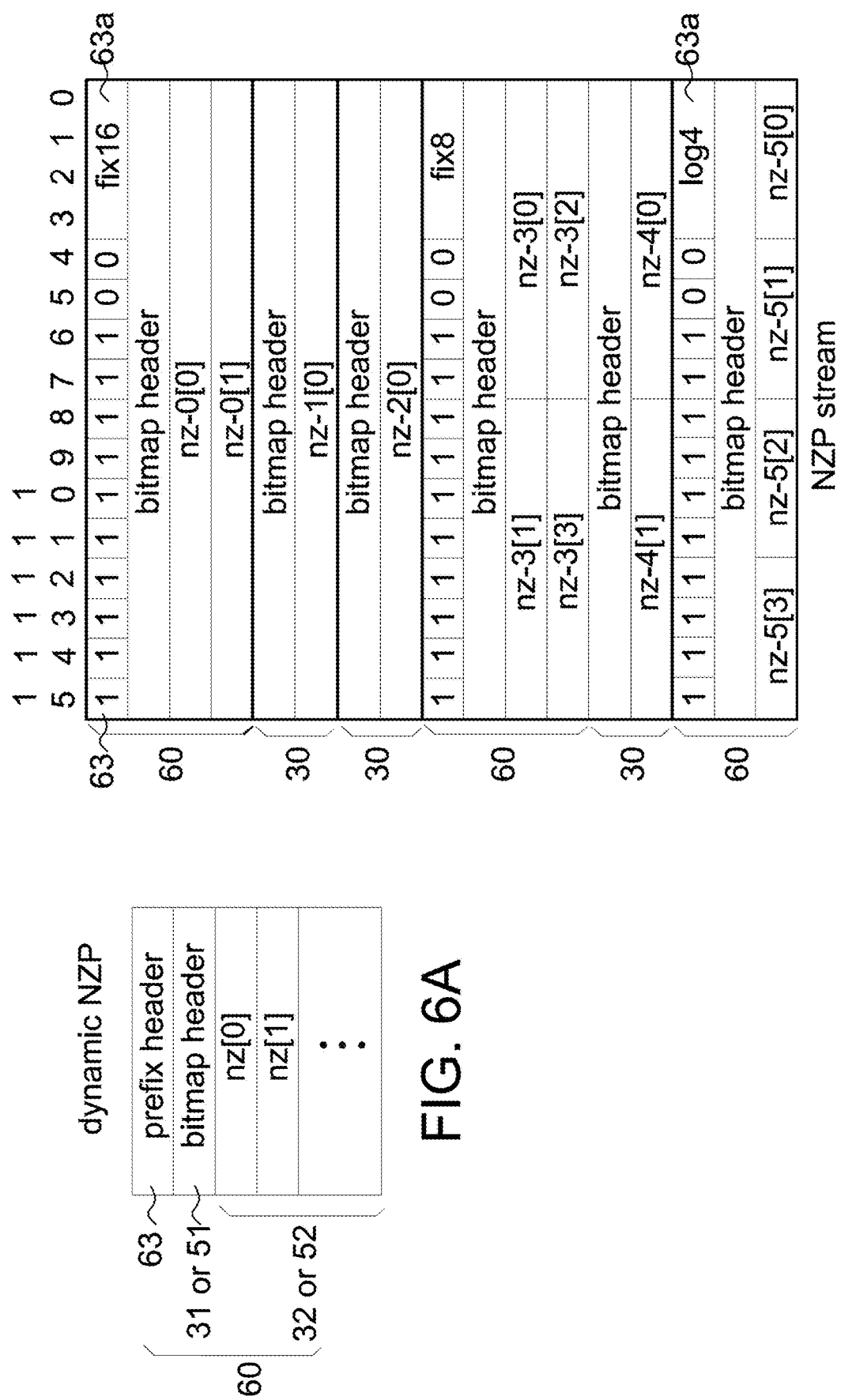
FIG. 6A is a diagram showing a dynamic NZP 60 with a prefix header.
FIG. 6B is an example showing a NZP stream with a sequence of NZPs 60/30.

Besides the bitmap header (31 or 51), a NZP may optionally include a prefix header 63 to specify the data format of the NZ elements in the payload (32 or 52). As shown in FIG. 6A, a dynamic NZP 60 includes a prefix header 63, a bitmap header (31 or 51) and a payload (32 or 52). The prefix header 63 includes a control codeword field 63a that specifies the data format of the NZ elements in the payload (32 or 52). The prefix header 63 also includes a hierarchy field 63b that indicates whether it is a hierarchical NZP (will be described below). In practice, the NZ element in the payload can be packetized in various data formats to increase the data compression rate of the NZPs. The data formats include, with limitation, fixed-point four bits (fix4), fixed-point eight bits (fix8), fixed-point 16 bits (fix16), fixed-point 32 bits (fix32), floating-point eight bits (flp8), floating-point 16 bits (flp16), floating-point 32 bits (flp32) and four bits logarithm (log 4). Regarding each data format, a corresponding control codeword is assigned to the control codeword field 63a. Assuming that a dynamic NZP-w 60 is fed into the parser 412 in FIG. 4A, the parser 412 extracts the control codeword from the control codeword field 63a and issues a corresponding data size ds to the address decoder 424 and the SRAM 422. The address decoder 424 can correctly calculate the weight offsets/addresses for the NZ elements in the SRAM 422 according to the data size ds, and the SRAM 422 can correctly output a corresponding NZ element according to the weight address and the data size ds. The data sizes include, without limitation, a nibble, a byte, a word and a double word. FIG. 6B is an example showing a NZP stream with a sequence of NZPs 60/30. Referring to the example in FIG. 6B, the first four bits ($b_0$ to $b_3$, i.e., the control codeword field 63a) in the prefix header 63 of each dynamic NZP 60 is set to a predefined control codeword that defines the data format of the NZ elements in the same dynamic NZP 60 and the following NZPs 30 until the next dynamic NZP 60 defines a new data format; meanwhile, $b_4$ and $b_5$ (i.e., a hierarchy field 63b) in each prefix header 63 are set to zero if it is not a hierarchical NZP; $b_6$-$b_{15}$ are set to one in each prefix header 63, where $b_k$ denotes $k^{th}$ binary digit in the prefix header 63, for k=0~15.

According to the data format defined in the control codeword field 63a of a dynamic NZP-w 60, a parser 412 can decode the compressed data (the payload 32/52) with nearly zero computation cost. Besides, according to the data format, the value ranges of the NZ elements in the payload 32/52 can be dynamically changed by multiplying a gain or calculating a mathematical equation. In one embodiment, in order to dynamically change the value ranges of the NZ elements in the payload 32/52, a gain factor gn is embedded in the control codeword field 63a for the data formats log 4 and fix8 and a plurality of mathematical equations are respectively provided for the data formats log 4, fix8, flp8 and flp 16 as shown in Table-1.

TABLE 1

| data format | control codeword field | | | | equation |
|---|---|---|---|---|---|
| | $b_3$ | $b_2$ | $b_1$ | $b_0$ | |
| fix8 | 0 | | gn[2:0] | | Output value = (nz[7:0]) * (1 << gn[2:0]) |
| log4 | 1 | 0 | | gn[1:0] | Output value = (1 << nz[3:0]) * (1 << gn[1:0]) |
| flp8 | 1 | 1 | 0 | 0 | Output value = flp2fix(1.3.4) |
| fix4 | 1 | 1 | 0 | 1 | Output value = nz[3:0] |
| fix16 | 1 | 1 | 1 | 0 | Output value = nz[15:0] |
| flp16 | 1 | 1 | 1 | 1 | Output value = flp2fix(1.5.10) |

For example, if the control codeword field 63a contains a value of 0b1110, it indicates the data format of the following NZ elements is fix16 and its output value is equal to its corresponding NZ element nz[15:0] (indicating the value ranges of the NZ elements in the payload 32/52 do not change). Thus, its gain is equal to 1. Correspondingly, the parser 412 sets a gain to 1 and then issues the gain to the multiplier 460. If the control codeword field 63a contains a value of 0b0xxx, it indicates the data format is fix8 and the gain factor is equal to gn[2:0] (see Table-1). According to its equation in Table-1, the parser 412 left-shifts 1 by gn[2:0] to obtain a shifted value, sets a gain to the shifted value and then issues the gain to the multiplier 460. If the control codeword field 63a contains a value of 0b1111, it indicates the data format of the following NZ elements is flp16. According to its equation in Table-1, a floating point to fix point converter (not shown) needs to be connected to the output terminal of the SRAM 422 to perform the floating point to fix point conversion (i.e., flp2fix(1.5.10)) on each of the following NZ elements from the SRAM 422. Correspondingly, the parser 412 sets a gain to 1 and then issues the gain to the multiplier 460. Please note that the location of the control codeword field 63a in the prefix header 63, the bit length of the control codeword field 63a, the data formats, the control codewords and the equations in Table-1 are provided by way of example and not limitations of the invention. In the actual implementations, the location and the bit length of the control codeword field 63a, the data formats, the control codewords and the equations in Table-1 can be modified and this also falls in the scope of the invention. Please note that although the dynamic NZP 60 is only applied to the matrix W (i.e., the parser 412, the address decoder 424, the SRAM 422 and multiplier 460) in the above embodiment, it should be noted that the invention is not so limited, the dynamic NZP 60 is also applicable to the matrix X (i.e., the compressor 411, the address decoder 423, the SRAM 421 and multiplier 460 with appropriate wiring and configuration).

Figure 7A:
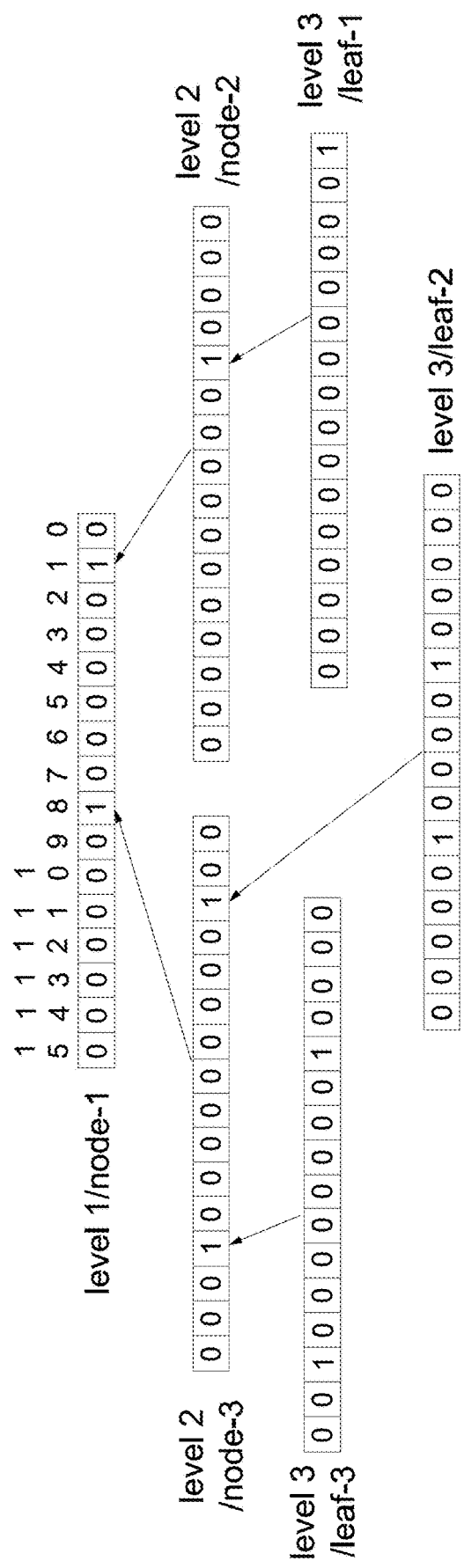
FIG. 7A is a diagram showing a very huge data/weight vector (4096×1) represented by three-level hierarchical NZP.
Figure 7B:
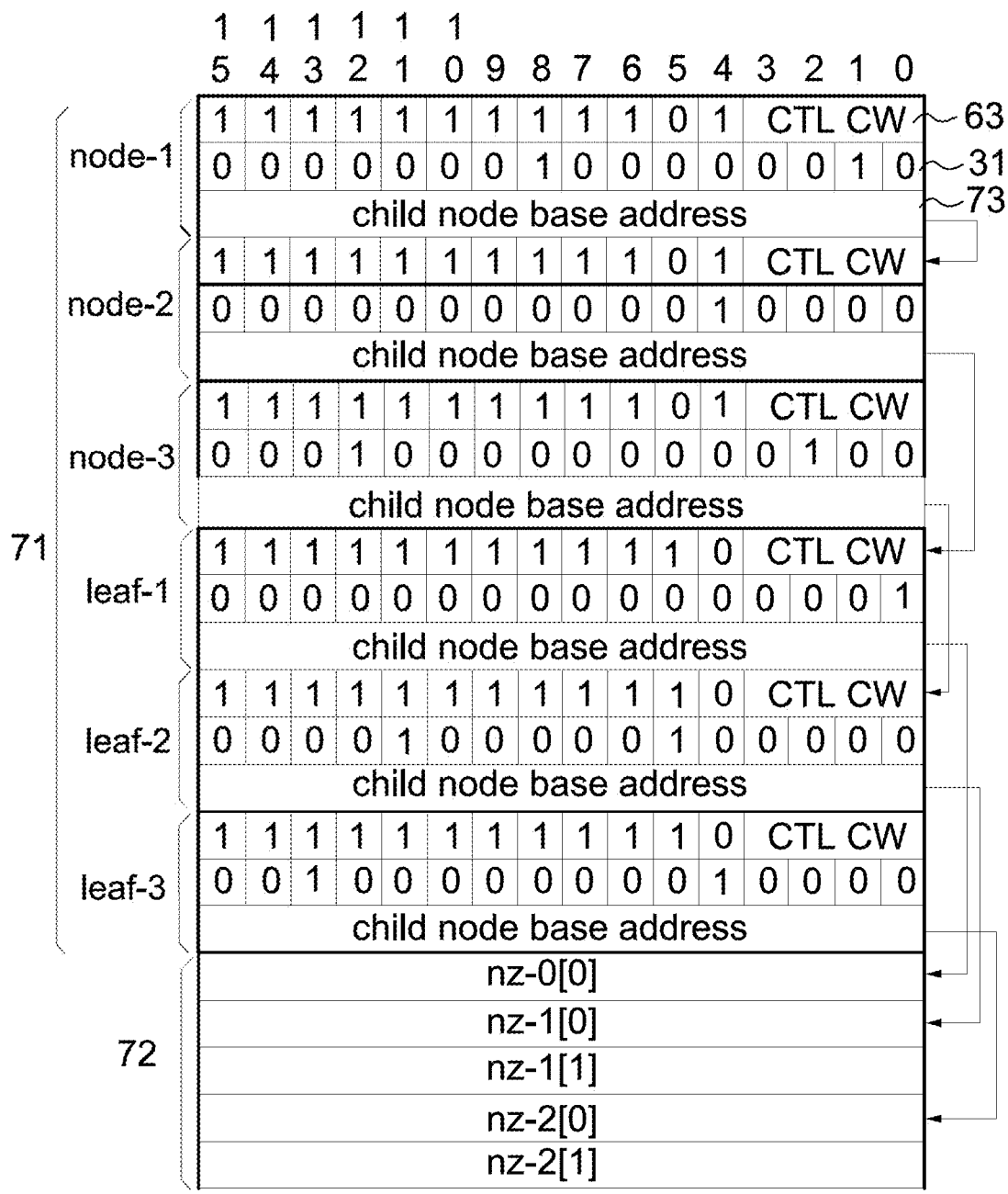
FIG. 7B is an example of a hierarchical NZP according to the example in FIG. 7A.

The invention supports a hierarchical NZP for a very huge data/weight vector, making NZ element retrieval more flexible for element-wise multiplications. FIG. 7A is a diagram showing a very huge data/weight vector (4096×1) represented by bitmap headers 31 of a three-level hierarchical NZP. Referring to FIG. 7A, due to the data/weight vector with a large size (4096×1), its elements are divided into three levels for accelerating the dot product of a very huge data vector X and a very huge weight vector W. For a node (level 1/2) bitmap header 31 having 16 bits, each bit represents 16 bits of its child node or its following level; for a leaf (level 3) bitmap header 31 having 16 bits, each bit represents an element in the vector X/W. For example, $b_0$ in level 1/node-1 equal to 0 indicates there are 16 zero bits in its child node and thus its child node is skipped for the bitwise logical AND operation; $b_1$ in level 1/node-1 equal to 1 represents there is at least one NZ bit in its child node and thus its child node has to perform the bitwise logical AND operation. FIG. 7B is an example of a hierarchical NZP according to the example in FIG. 7A. Referring to FIG. 7B, leaves follow nodes and NZ elements follow leaves in the hierarchical NZP 70. The hierarchical NZP 70 includes a node/leaf section 71 and a payload 72. The node/leaf section 71 includes three nodes and three leaves in the example in FIG. 7A. Each node/leaf includes a prefix header 63, a bitmap header 31 and a child node base address 73 (i.e., a pointer that points to the start address of its child node or its corresponding NZ elements in the payload 72). In general, the number of nodes is greater than zero and the number of leaves is greater than or equal to zero in the node/leaf section 71.

The operations of the acceleration apparatus 400A are described with reference to the examples in FIGS. 7A-7B. Assuming raw data of a huge data vector (4096×1) and a hierarchical NZP-w 70 are respectively inputted into the compressor 411 and the parser 412 of the acceleration apparatus 400A, the compressor 411 is configured to compress raw data of the huge data vector into a hierarchical NZP-x 70 having the node/leaf section 71 and the payload 72, the parser 412 is configured to parse the hierarchical NZP-w 70 to divide the hierarchical NZP 70 into the node/leaf section 71 section and its payload 72, and the address decoders 423 and 424 are configured to be enabled/disabled in response to the control signals CS1/CS2. At first, the compressor 411 and the parser 412 sends two bitmap headers 31 of node-1 for the hierarchical NZP-x 70 and the hierarchical NZP-w 70 to the AND gate array 425 (having 16 AND gates), and send the control signals CS1 and CS2 with a first voltage state to disable the address decoders 423 and 424. If all bits in the output bitmap o-bm from the AND gate array 425 are equal to 0, the MAC operation for the hierarchical NZP-x 70 and the hierarchical NZP-w 70 is discarded; otherwise, the compressor 411 and the parser 412 send their corresponding child node/leaf bitmap headers 31 to the AND gate array 425 based on the child node base address and the location of the NZ bits in the output bitmap and. This process is repeated until the node/leaf bitmap headers are all processed. According to the hierarchy fields 63b ($b_4$ and $b_5$) in the prefix headers 63 of the hierarchical NZP-x 70 and the hierarchical NZP-w 70, the compressor 411 and the parser 412 respectively identify their hierarchical types (a node or a leaf). For example, if the hierarchy field 63b contains a value of 0b01 in the hierarchical NZP-x 70 and the hierarchical NZP-w 70, it indicates this is a node and the compressor 411 and the parser 412 send the control signals CS1 and CS2 with the first voltage state to disable the address decoders 423 and 424, and send corresponding bitmap headers 31 to the AND gate array 425 based on the location of the NZ bits in the output bitmap and the child node base address (without sending out any NZ element); if the hierarchy field 63b contains a value of 0b10 in the hierarchical NZP-x 70 and the hierarchical NZP-w 70, it indicates this is a leaf and the compressor 411 and the parser 412 send the control signals CS1 and CS2 with a second voltage state to enable the address decoders 423/424, send corresponding bitmap headers 31 to the AND gate array 425 and the address decoders 423 and 424, and send corresponding NZ elements to the SRAMs 421 and 422 based on the child node base address; according to o-bm and the bitmap headers 31, the address decoders 423 and 424 respectively calculate at least one data/weight offset for at least one NZ element and add the at least one data/weight offset and the base-addresses b-addr1/b-addr2 in SRAMs 421/422 to output at least one data/weight address. If the hierarchy field 63b contains a value of 0b00, it indicates this is not a hierarchical NZP. Afterward, the MAC 450 sequentially calculates products of corresponding NZ elements from the SRAMs 421 and 422 and sequentially adds the products to the accumulator 453 to produce an accumulate value. In the above process of calculating a dot product of the very huge data and weight vectors, the hierarchical NZP improves computation performance by directly skipping a bunch of zero-valued multiplications in the nodes and the leaves and by focusing on NZ element multiplications. The three levels of the hierarchical NZP in FIGS. 7A and 7B are provided by way of example and not limitations of the invention. In practice, the number of levels in the hierarchical NZP depends on the total number of elements in the data/weight vector and the bit length of the bitmap header 31.

Figure 8:
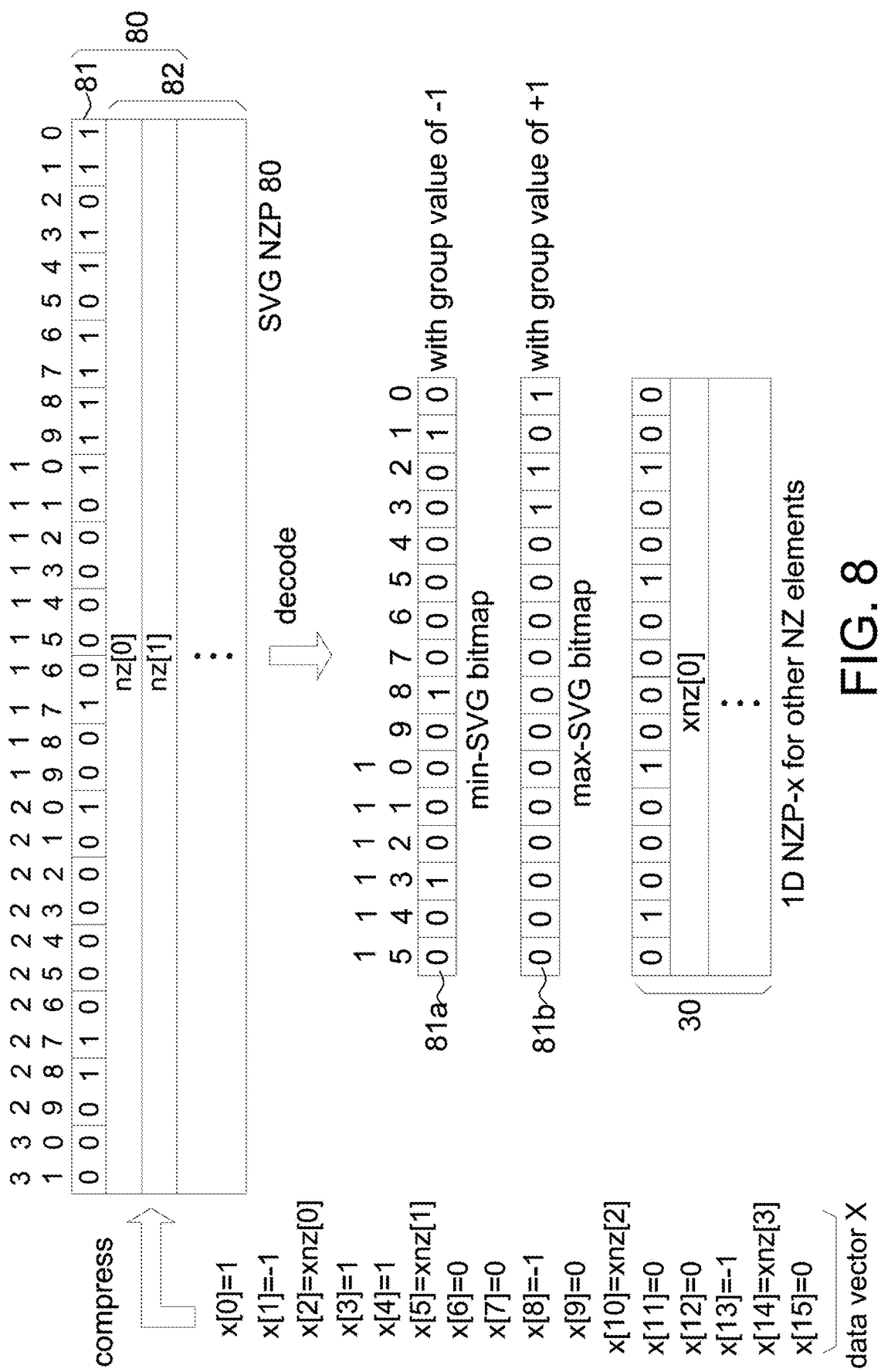
FIG. 8 is an example of a data vector X and a SVG NZP 80 with two SVGs.

Activation functions are an extremely important feature of the artificial neural networks. They basically decide whether a neuron should be activated or not. The activation function is the non-linear transformation over its input signal. The transformed output is then delivered to the next layer of neurons as input. Some activation functions saturate at a specified value, such as the ReLu function saturating at 0. Accordingly, the outputs x[i] of a previous layer including an activation function with the saturation property include at least one same-value-group (SVG), and the synapse value of the SVG is normally the maximum/minimum value. For example, the tan h function saturates at 1 and −1, and the outputs x[i] of a previous layer including the tan h function can be grouped into four groups: two SVGs (their group values respectively equal to −1 and +1), one zero-valued group and one variable group (their NZ elements not equal to −1 and +1) as shown in left side of FIG. 8. Grouping the same-value NZ elements x[i] together (i.e., SVG) facilitates computation of the above propagation function by reducing the number of multiplications and saving the storage space for the same NZ elements. FIG. 8 is an example of a data vector X (with 16 elements x[i], where i=0~15) and a SVG NZP 80 with two SVGs. Referring to FIG. 8, the SVG NZP 80 includes a bitmap header 81 and a payload 82. To support two SVGs, one zero-valued group and one variable group, every P(=2) bits in the bitmap header 81 of the SVG NZP 80 define a corresponding element x[i] of the data vector X by indicating one of the following Q(=4) categories: zero, variables (their values not equal to −1 and 1), maximum (+1) and minimum (−1). Here, $2^P >= Q$.

Figure 4B:
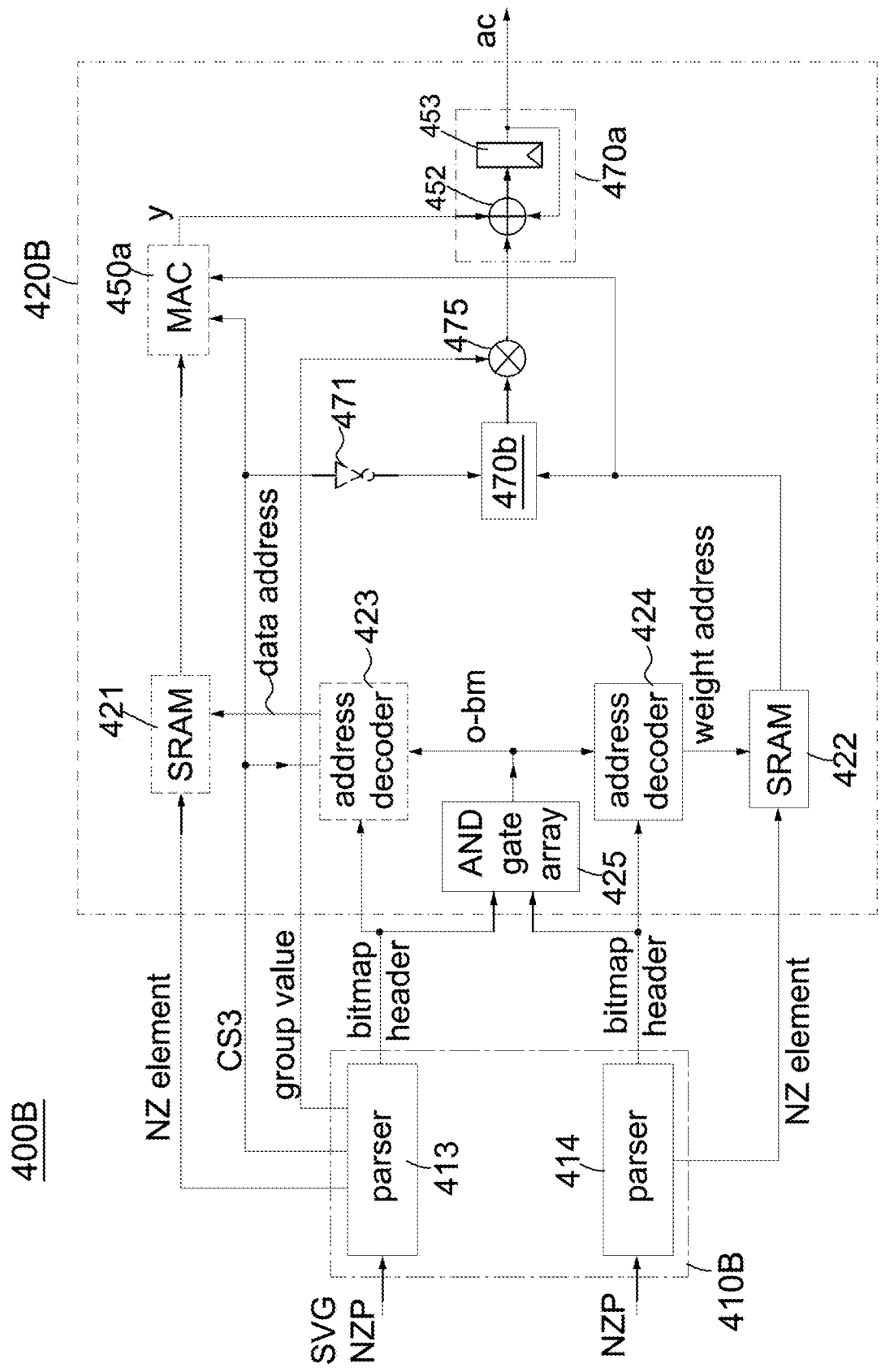
FIG. 4B is a block diagram of acceleration apparatus according to another embodiment of the invention.

FIG. 4B is a block diagram of acceleration apparatus according to another embodiment of the invention. Referring to FIG. 4B, an acceleration apparatus 400B of the invention includes a front-end module 410B and a NZ packet engine 420B. The acceleration apparatus 400B of the invention, applied to an in an artificial neuron, is used to perform sparse data matrix X by sparse weight matrix W multiplication. Here, the data matrix X include at least one SVG. The front-end module 410B includes a parser 413 and a parser 414. The NZ packet engine 420B includes two SRAMs 421 and 422, two address decoders 423 and 424, a AND gate array 425, a MAC 450a, two accumulating devices 470a and 470b, a inverter 471 and a multiplier 475. The MAC 450a has all the functions that the MAC 450 has and the accumulating device 470b has all the similar functions that the accumulating device 470a has; in addition, the MAC 450a and the accumulating device 470b are disabled/enabled in response to a control signal CS3.

The operations of the acceleration apparatus 400B are described with reference to the example in FIG. 8. In one embodiment, a SVG NZP 80 and a 1D NZP-w 30 are respectively inputted into the parser 413 and the parser 414 of the acceleration apparatus 400B. The parser 413 is configured to parse the SVG NZP 80 to decode the bitmap header 81 and its payload 82 of the SVG NZP 80 into a min-SVG bitmap 81a with a group value of −1, a max-SVG bitmap 81b with a group value of +1 and a 1D NZP-x 30 for other NZ elements except −1 and +1 (i.e., corresponding to the variable group), as shown in FIG. 8. The parser 414 is configured to parse the 1D NZP-w 30 to divide the 1D NZP-w 30 into the bitmap header 31 and its payload 32. Please note that the 1D NZP-x 30 doesn't work with the min-SVG bitmap 81a and the max-SVG bitmap 81b at the same time. Stated in another way, the accumulating device 470b doesn't work with the address decoder 423 and the MAC 450a at the same time.

In one embodiment, the min-SVG bitmap 81a and the max-SVG bitmap 81b are first processed and then the 1D NZP-x 30 follows in the acceleration apparatus 400B. In this embodiment, the parser 413 sends a control signal CS3 with a first voltage level to disable the address decoder 423 and the MAC 450a and to enable the accumulating device 470b. Afterwards, the parser 413 sends the min-SVG bitmap 81a to the AND gate array 425 and sends the group value of −1 to the multiplier 475. The AND gate array 425 with sixteen AND gates performs a bitwise logical AND operation between the min-SVG bitmap 81a and the bitmap header 31 of the NZP-w 30 in parallel to generate the output bitmap o-bm. Next, according to o-bm and the bitmap header 31 of the NZP-w, the address decoder 424 sequentially calculates at least one weight offset for at least one NZ element and respectively adds the at least one weight offset and the base-address b-addr2 in SRAM 422 to output at least one weight address. Correspondingly, the SRAM 422 sequentially outputs their corresponding NZ elements (i.e., weight values) to the accumulating device 470b based on the at least one weight address. Next, the accumulating device 470b accumulates the outputs from the SRAM 422 and the multiplier 475 calculates a first product of the output of the accumulating device 470b and the group value of −1 for the minimum SVG. Then, the adder 452 adds the first product to the accumulator 453. As can be observed from above, since the min-SVG bitmap 81a is accompanied with the group value of −1 (i.e., its NZ elements are equal to −1), there is no need to store the group value of −1 in the SRAM 421; besides, instead of multiplying each group value of −1 with its corresponding weight value, all their corresponding weight values are first summed up and then its sum is multiplied by the group value of −1. Thus, the number of multiplications is reduced, the storage space for the group value is saved and the processing speed is enhanced.

As to the max-SVG bitmap 81b, the acceleration apparatus 400B operates in the same manner as with the min-SVG bitmap 81a. Accordingly, the multiplier 475 generates a second product of the output of the accumulating device 470b and the group value of +1 for the maximum SVG. The adder 452 adds the second product and the first product and stores the sum to the accumulator 453. As to the 1D NZP-x 30 for other NZ elements except −1 and +1, the parser 413 sends the control signal CS3 with a second voltage level to enable the address decoder 423 and the MAC 450a and disable the accumulating device 470b. Afterwards, the parser 413 sends the bitmap 31 of the 1D NZP-x 30 to the AND gate array 425 and the address decoder 423. The following computation process is the similar as the operations in connection with FIGS. 3A, 3B and 4A and thus the description for the 1D NZP-x 30 is omitted herein. Then, the adder 452 adds the output y of the MAC 450a and the output (equal to the second product and the first product) of accumulator 453 and then stores its sum to the accumulator 453. Finally, the accumulator 453 produces an accumulation value ac.

In an alternative embodiment, the 1D NZP-x 30 is first processed and then the min-SVG bitmap 81a and the max-SVG bitmap 81b follow. As long as the 1D NZP-x 30, the min-SVG bitmap 81a and the max-SVG bitmap 81b are not processed in parallel, their results (ac) are the same. Please note that the format of the bitmap header 81 accommodating the two SVGs are provided by way of example, and not limitations of the invention. In practice, any other number of SVGs are also applicable to the bitmap header 81 and the acceleration apparatus 400B. Please also note that whether the variable group is formed depends on the values of the NZ elements in the data matrix X and the upper limit for the number of SVGs. In an embodiment, a upper limit for the number of SVGs is set to two; if the NZ elements in the data matrix X is divided into three or more value groups, two of the value groups are selected to form two SVGs and the other value groups form the variable group; if the NZ elements in the data matrix X is divided into two or less value groups, the two or less value groups form two or less SVGs and thus no variable group is formed. If no variable group is formed, the address decoder 423 and the MAC 450a are disabled, or the SRAM 421, the address decoder 423 and the MAC 450a are discarded in the acceleration apparatus 400B. Since the SRAM 421, the address decoder 423 and the MAC 450a are optional in the acceleration apparatus 400B, they are represented by dash lines in FIG. 4B. Besides, The SRAMs 421 and 422 in FIGS. 4A and 4B can be replaced with any volatile and non-volatile storage devices.

The acceleration apparatus 400A/B according to the invention may be hardware, software, or a combination of hardware and software (or firmware). An example of a pure solution would be a field programmable gate array (FPGA) design or an application specific integrated circuit (ASIC) design. In a preferred embodiment, the acceleration apparatus 400A/B is implemented with a general-purpose processor and a program memory. The program memory stores a processor-executable program. When the processor-executable program is executed by the general-purpose processor, the general-purpose processor is configured to function as: the compressor 411, the parser 412/413/414, the address decoder 423/424, the AND gate array 425, the MAC 450/450a, the multiplier 460/475 and the accumulating device 470a/b.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. An acceleration apparatus applied in an artificial neuron, comprising:

an AND gate array comprising a plurality of AND gates for receiving a first bitmap and a second bitmap to generate an output bitmap;

a first storage device for sequentially storing a first payload comprising M1 non-zero first elements and outputting a corresponding non-zero first element according to a first access address associated with a result of comparing the first bitmap with the output bitmap;

a second storage device for sequentially storing a second payload comprising M2 non-zero second elements and outputting a corresponding non-zero second element according to a second access address associated with a result of comparing the second bitmap with the output bitmap; and a multiply-accumulate (MAC) circuit coupled to the output terminals of the first and the second storage devices for generating a product of the corresponding non-zero first element and the corresponding non-zero second element, and for generating a current accumulation value based on the product and at least one previous accumulate value;

wherein the first bitmap contains location information for the M1 non-zero first elements in the first payload, and the second bitmap contains location information for the M2 non-zero second elements in the second payload.

2. The acceleration apparatus according to claim 1, wherein a first non-zero packet (NZP) associated with a first matrix comprises a first super-header and the first payload, and a second NZP associated with a second matrix comprises a second super-header and the second payload, and wherein the first super-header and the second super-header respectively comprise the first bitmap and the second bitmap.

3. The acceleration apparatus according to claim 2, wherein each bit in the first bitmap indicates whether a corresponding first element in the first matrix is equal to zero, and each bit in the second bitmap indicates whether a corresponding second element in the second matrix is equal to zero.

4. The acceleration apparatus according to claim 2, further comprising:
a first front end circuit for converting one of the first NZP and raw data of the first matrix into the first bitmap and the first payload, supplying the first bitmap to the AND gate array, and supplying the first payload to the first storage device; and
a second front end circuit for converting one of the second NZP and raw data of the second matrix into the second bitmap and the second payload, supplying the second bitmap to the AND gate array, and supplying the second payload to the second storage device.

5. The acceleration apparatus according to claim 4, wherein each of the first front end circuit and the second front end circuit is one of a parser and a compressor.

6. The acceleration apparatus according to claim 4, further comprising:
a first address decoder coupled to the first front end circuit and the AND gate array for determining a first offset according to the result of comparing the first bitmap with the output bitmap and adding a first base address and the first offset to generate the first access address; and
a second address decoder coupled to the second front end circuit and the AND gate array for determining a second offset according to the result of comparing the second bitmap with the output bitmap and adding a second base address and the second offset to generate the second access address;

wherein the M1 non-zero first elements are sequentially stored from the first base address in the first storage device, and the M2 non-zero second elements are sequentially stored from the second base address in the second storage device.

7. The acceleration apparatus according to claim 6, further comprising:
a multiplier coupled to the output terminal of the MAC circuit and at least one of the first front end circuit and the second front end circuit;
wherein at least one of the first super-header and the second super-header further comprises a prefix header, wherein the prefix header comprises a control codeword field defining a data format of the non-zero elements in the current NZP and the following NZPs without any prefix header; and
wherein according to the control codeword field in the at least one of the first NZP and the second NZP, a corresponding front end circuit issues a data size to a corresponding storage device and a corresponding address decoder and issues a gain to the multiplier.

8. The acceleration apparatus according to claim 1, further comprising:
a third front end circuit for converting one of a first NZP and raw data of a first matrix into a third bitmap and the first payload, sequentially supplying a predefined portion of the third bitmap as the first bitmap to the AND gate array, and supplying the first payload to the first storage device;
a fourth front end circuit for converting one of a second NZP and raw data of a second matrix into the second bitmap and the second payload, supplying the second bitmap to the AND gate array, and supplying the second payload to the second storage device;
wherein the first non-zero packet (NZP) associated with a first matrix comprises the third bitmap and the first payload, and the second NZP associated with a second matrix comprises the second bitmap and the second payload;
wherein a size of the third bitmap are greater than that of the second bitmap, and wherein a size of the second matrix is equal to that of a predefined window; and
wherein the predefined portion of the third bitmap correspond to an overlap of the predefined window sliding all over the first matrix.

9. The acceleration apparatus according to claim 2, wherein each of the first super-header and the second super-header further comprises N1 nodes and N2 leaves, wherein each of the N1 nodes and the N2 leaves comprises a prefix header, a bitmap header and a child node base address, and the prefix header comprises a hierarchy field that indicates a hierarchical type, wherein the child node base address points to its child node if the hierarchical type indicates a node, and wherein the child node base address points to a start address of its corresponding non-zero elements in the corresponding payload if the hierarchical type indicates a leaf, where N1>0, N2>=0.

10. The acceleration apparatus according to claim 9, further comprising:
a third address decoder, enabled when the hierarchical type indicates a leaf, that determines a first offset according to the result of comparing the first bitmap with the output bitmap and adding a first base address and the first offset to generate the first access address;

a fourth address decoder, enabled when the hierarchical type indicates a leaf, that determines a second offset according to the result of comparing the second bitmap with the output bitmap and adding a second base address and the second offset to generate the second access address;

a fifth front end circuit for converting one of the first NZP and raw data of the first matrix, wherein if its hierarchical type indicates a node, the fifth front end circuit sends a corresponding bitmap header as the first bitmap to the AND gate array based on at least one location of at least one non-zero bit in the output bitmap and its child node base address, wherein if the hierarchical type indicates a leaf, the ifith front end circuit sends a corresponding bitmap header as the first bitmap to the AND gate array and the third address decoder and sends corresponding non-zero first elements as the first load to the first storage device based on the child node base address; and a sixth front end circuit for converting one of the second NZP and raw data of the second matrix, wherein if the hierarchical type indicates a node, the fourth front end circuit sends a corresponding bitmap header as the second bitmap to the AND gate array based on at least one location of at least one non-zero bit in the output bitmap and the child node base address, wherein if the hierarchical type indicates a leaf, the fourth front end circuit sends a corresponding bitmap header as the second bitmap to the AND gate array and the fourth address decoder and sends corresponding non-zero second elements to the second storage device based on the child node base address;

wherein the non-zero first elements are sequentially stored from the first base address in the first storage device, and the non-zero second elements are sequentially stored from the second base address in the second storage device.

11. An acceleration method applied in an artificial neuron, comprising the steps of:

performing a bitwise logical AND operation between a first bitmap and a second bitmap to generate an output bitmap;

sequentially storing a first payload comprising M1 non-zero first elements in a first storage device and a second payload comprising M2 non-zero second elements in a second storage device;

outputting a corresponding non-zero first element by the first storage device according to a first access address associated with a result of comparing the first bitmap with the output bitmap and outputting a corresponding non-zero second element by the second storage device according to a second access address associated with a result of comparing the second bitmap with the output bitmap;

calculating and accumulating a product of the corresponding non-zero first element and the corresponding non-zero second element; and repeating the steps of outputting and calculating and accumulating until at least one non-zero bit in the output bitmap is processed to obtain an accumulation value;

wherein the first bitmap contains location information for the M1 non-zero first elements in the first payload, and the second bitmap contains location information for the M2 non-zero second elements in the second payload.

12. The acceleration method according to claim 11, wherein a first non-zero packet (NZP) associated with a first matrix comprises a first super-header and the first payload, and a second NZP associated with a second matrix comprises a second super-header and the second payload, wherein the first super-header and the second super-header respectively comprise the first bitmap and the second bitmap.

13. The acceleration method according to claim 12, wherein each bit in the first bitmap indicates whether a corresponding first element in the first matrix is equal to zero, and each bit in the second bitmap indicates whether a corresponding second element in the second matrix is equal to zero.

14. The acceleration method according to claim 12, further comprising:

converting one of the first NZP and raw data of the first matrix into the first bitmap and the first payload; and converting one of the second NZP and raw data of the second matrix into the second bitmap and the second payload.

15. The acceleration method according to claim 11, further comprising:

determining a first offset according to the result of comparing the first bitmap with the output bitmap and adding a first base address and the first offset to generate the first access address before the step of outputting; and determining a second offset according to the result of comparing the second bitmap with the output bitmap and adding a second base address and the second offset to generate the second access address before the step of outputting;

wherein the M1 non-zero first elements are sequentially stored from the first base address in the first storage device, and the M2 non-zero second elements are sequentially stored from the second base address in the second storage device.

16. The acceleration method according to claim 12, further comprising:

determining a first data size and a first gain according to a control codeword field in the first NZP;

determining a second data size and a second gain according to the control codeword field in the second NZP;

sending the first data size to the first storage device and the second data size to the second storage device before the step of outputting; and multiplying the first gain, the second gain and the accumulation value to obtain a result after the step of repeating;

wherein each of the first super-header and the second super-header further comprises a prefix header, wherein the prefix header comprises the control codeword field defining a data format of the non-zero elements in the current NZP and the following NZPs without any prefix header.

17. The acceleration method according to claim 11, further comprising:

converting one of a first NZP and raw data of a first matrix into a third bitmap and the first payload;

sequentially providing a predefined portion of the third bitmap as the first bitmap; and converting one of a second NZP and raw data of a second matrix into the second bitmap and the second payload;

wherein the first NZP associated with the first matrix comprises the third bitmap and the first payload, and the second NZP associated with the second matrix comprises the second bitmap and the second payload;

wherein a size of the third bitmap are greater than that of the second bitmap, and a size of the second matrix is equal to that of a predefined window; and wherein the predefined portion of the third bitmap corresponds to an overlap of the predefined window sliding all over the first matrix.

18. The acceleration method according to claim 12, wherein each of the first super-header and the second super-header further comprises N1 nodes and N2 leaves and each of the N1 nodes and the N2 leaves comprises a prefix header, a bitmap header and a child node base address, wherein the prefix header comprises a hierarchy field that indicates a hierarchical type, wherein the child node base address points to its child node if the hierarchical type indicates a node, and wherein the child node base address points to a start address of its corresponding non-zero elements in the corresponding payload if the hierarchical type indicates a leaf, where N1>0, N2>=0.

19. The acceleration method according to claim 18, further comprising:
  converting one of the first NZP and raw data of the first matrix into the first super-header and the first payload, and converting one of the second NZP and raw data of the second matrix into the second super-header and the second payload;
  respectively checking the hierarchy fields in the first super-header and the second super-header;
  if the hierarchical type of the first super-header indicates a node, providing a corresponding bitmap header as the first bitmap based on at least one location of at least one non-zero bit in the output bitmap and the child node base address,
  if the hierarchical type of the first super-header indicates a leaf, providing a corresponding bitmap header as the first bitmap and providing corresponding non-zero first elements for the first storage device based on the child node base address;
  if the hierarchical type of the second super-header indicates a node, providing a corresponding bitmap header as the second bitmap based on at least one location of at least one non-zero bit in the output bitmap and the child node base address; and
  if the hierarchical type of the second super-header indicates a leaf, providing a corresponding bitmap header as the second bitmap and providing corresponding non-zero second elements for the second storage device based on the child node base address;
  wherein the non-zero first elements are sequentially stored from the first base address in the first storage device, and the non-zero second elements are sequentially stored from the second base address in the second storage device.

20. An acceleration apparatus applied in an artificial neuron, comprising:
  an AND gate array comprising a plurality of AND gates and receiving a first bitmap and one of P1 bitmaps to generate an output bitmap;
  a first storage device for sequentially storing a first payload comprising M1 non-zero first elements and outputting a corresponding non-zero first element according to a first access address associated with a result of comparing the first bitmap with the output bitmap; and
  a calculation circuit for calculating and accumulating a product according to one of P1 different group values and a sum of the outputs from the first storage device for each of the P1 bitmaps to generate an accumulation value;
  wherein the first bitmap contains location information for the M1 non-zero first elements in the first payload; and
  wherein the P1 bitmaps respectively operate in conjunction with the P1 different group values.

21. The acceleration apparatus according to claim 20, further comprising:
  a second storage device for sequentially storing a second payload comprising M2 non-zero second elements and outputting a corresponding non-zero second element according to a second access address associated with a result of comparing the second bitmap with the output bitmap;
  wherein the AND gate array further receives the first bitmap and one of a second bitmap and the P1 bitmaps to generate the output bitmap;
  wherein the calculation circuit calculates a dot product of two element sequences from the first storage device and the second storage device when the AND gate array receives the second bitmap, and calculates the product according to a corresponding group value and a sum of the outputs from the first storage device for one of the P1 bitmaps when the AND gate array receives the one of the P1 bitmaps, wherein the calculation circuit accumulates the dot product and the products for the P1 bitmaps to generate the accumulation value; and
  wherein the second bitmap contains location information for the M2 non-zero second elements in the second payload.

22. The acceleration apparatus according to claim 21, wherein a first non-zero packet (NZP) associated with a first matrix comprises the first bitmap and the first payload, and a second NZP associated with a second matrix comprises a third bitmap and a third payload, wherein the second matrix comprises M3 second elements that are divided into a zero-valued group, a variable group and P1 same-value groups, wherein the values of the M2 non-zero second elements in the second payload are different from the P1 different group values, and wherein the P1 same-value groups are associated with the P1 bitmaps and the P1 different group values.

23. The acceleration apparatus according to claim 22, wherein each bit in the first bitmap indicates whether a corresponding first element in the first matrix is equal to zero, and every P2 bit in the third bitmap indicates which group a corresponding second element in the second matrix belongs to, where $2^{P2}>=(2+P1)$.

24. The acceleration apparatus according to claim 22, further comprising:
  a first address decoder coupled to the first storage device and the AND gate array for determining a first offset according to the result of comparing the first bitmap with the output bitmap and adding a first base address and the first offset to generate the first access address; and
  a second address decoder coupled to the second storage device and the AND gate array, enabled if the AND gate array receives the second bitmap, that determines a second offset according to the result of comparing the second bitmap with the output bitmap and adding a second base address and the second offset to generate the second access address;
  wherein the M1 non-zero first elements are sequentially stored from the first base address in the first storage device, and the M2 non-zero second elements are sequentially stored from the second base address in the second storage device.

25. The acceleration apparatus according to claim 22, further comprising:
   a first front end circuit for converting one of the first NZP and raw data of the first matrix into the first bitmap and the first payload, supplying the first bitmap to the AND gate array, and supplying the first payload to the first storage device; and
   a second front end circuit for converting one of the second NZP and raw data of the second matrix into the second bitmap, the second payload, the P1 bitmaps and the P1 different group values, supplying the P1 bitmaps and the second bitmap to the AND gate array, supplying the P1 different group values to the calculation circuit, and supplying the second payload to the second storage device.

26. The acceleration apparatus according to claim 25, wherein the second front end circuit sends one of the P1 bitmaps to the AND gate array and a corresponding group value to the calculation circuit in parallel, wherein the P1 bitmaps and the second bitmap are sent to the AND gate array by the second front end circuit at different times.

27. The acceleration apparatus according to claim 25, wherein each of the first front end circuit and the second front end circuit is one of a parser and a compressor.

28. The acceleration apparatus according to claim 21, wherein the calculation circuit comprises:
   a multiply-accumulate (MAC) circuit, enabled when the AND gate array receives the second bitmap, that calculates the dot product of the two element sequences from the first storage device and the second storage device;
   a first accumulating circuit, enabled when the AND gate array receives one of the P1 bitmaps, that accumulates the outputs from the first storage device to generate the sum for each of the P1 bitmaps;
   a multiplier for multiplying the sum by a corresponding group value to generate the product for one of the P1 bitmaps; and
   a second accumulating circuit for accumulating the dot product and the products for the P1 bitmaps to generate the accumulation value.

29. The acceleration apparatus according to claim 20, wherein a first non-zero packet (NZP) associated with a first matrix comprises the first bitmap and the first payload, and a second NZP associated with a second matrix comprises a third bitmap and a third payload, wherein the second matrix comprises M5 second elements that are divided into a zero-valued group and P1 same-value groups, and wherein the P1 same-value groups are associated with the P1 bitmaps and the P1 different group values.

30. The acceleration apparatus according to claim 29, wherein each bit in the first bitmap indicates whether a corresponding first element in the third matrix is equal to zero, and every P3 bit in the third bitmap indicates which group a corresponding second element belongs to, where $2^{P3} \geq (1+P1)$.

31. The acceleration apparatus according to claim 29, further comprising:
   an address decoder coupled to the first storage device and the AND gate array for determining a first offset according to the result of comparing the first bitmap with the output bitmap and adding a first base address and the first offset to generate the first access address; wherein the M1 non-zero first elements are sequentially stored from the first base address in the first storage device.

32. The acceleration apparatus according to claim 29, further comprising:
   a first front end circuit for converting one of the first NZP and raw data of the first matrix, supplying the first bitmap to the AND gate array, and supplying the first payload to the first storage device; and
   a second front end circuit for converting one of the second NZP and raw data of the second matrix into the P1 bitmaps and the P1 different group values, supplying the P1 bitmaps to the AND gate array, and supplying the P1 different group values to the calculation circuit.

33. The acceleration apparatus according to claim 32, wherein each of the first front end circuit and the second front end circuit is one of a parser and a compressor.

34. The acceleration apparatus according to claim 29, wherein the calculation circuit comprises:
   a first accumulating circuit for accumulating the outputs from the first storage device to generate the sum for each of the P1 bitmaps;
   a multiplier for multiplying the sum by a corresponding group value to generate the product; and
   a second accumulating circuit for accumulating the products for the P1 bitmaps to generate the accumulation value.

35. An acceleration method applied in an artificial neuron, comprising:
   sequentially storing a first payload comprising M1 non-zero first elements in a first storage device;
   performing a bitwise logical AND operation between a first bitmap and one of P1 bitmaps to generate an output bitmap;
   outputting each corresponding non-zero first element by the first storage device according to each first access address associated with a result of comparing the first bitmap with the output bitmap;
   calculating a product according to one of P1 different group values and a sum of the outputs from the first storage device for each of the P1 bitmaps;
   accumulating the product; and
   repeating the steps of performing, outputting, calculating and accumulating until the P1 bitmaps are processed to generate an accumulation value;
   wherein the first bitmap contains location information for the M1 non-zero first elements in the first payload; and
   wherein the P1 bitmaps respectively operate in conjunction with the P1 different group values.

36. The acceleration method according to claim 35, wherein the step of performing further comprises:
   performing the bitwise logical AND operation between the first bitmap and one of a second bitmap and the P1 bitmaps to generate the output bitmap.

37. The acceleration method according to claim 36, wherein the step of calculating further comprises:
   when the bitwise logical AND operation is performed between the first bitmap and the one of the P1 bitmaps, calculating the product according to a corresponding group value and the sum of the outputs from the first storage device for the one of the P1 bitmaps; and
   when the bitwise logical AND operation is performed between the first bitmap and the second bitmap, sequentially storing a second payload comprising M2 non-zero second elements in a second storage device, causing the second storage device to output each corresponding non-zero second element according to each second access address associated with a result of comparing the second bitmap with the output bitmap, and calculating a dot product of two element sequences from the first storage device and the second storage device.

38. The acceleration method according to claim 37, wherein the step of accumulating comprises:
when the bitwise logical AND operation is performed between the first bitmap and the one of the P1 bitmaps, accumulating the product for the one of the P1 bitmaps; and
when the bitwise logical AND operation is performed between the first bitmap and the second bitmap, accumulating the dot product.

39. The acceleration method according to claim 38, wherein the step of repeating:
repeating the steps of performing, outputting, calculating and accumulating until the P1 bitmaps and the second bitmap are processed to generate the accumulation value.

40. The acceleration method according to claim 37, wherein a first non-zero packet (NZP) associated with a first matrix comprises the first bitmap and the first payload, and a second NZP associated with a second matrix comprises a third bitmap and a third payload, wherein the second matrix comprises M3 second elements that are divided into a zero group, a variable group and P1 same-value groups, wherein the M2 non-zero second elements in the second payload are different from the P1 different group values, and wherein the P1 same-value groups are associated with the P1 bitmaps and the P1 different group values.

41. The acceleration method according to claim 40, wherein each bit in the first bitmap indicates whether a corresponding first element in the first matrix is equal to zero, and every P2 bit in the third bitmap indicates which group a corresponding second element belongs to, where $2^{P2} \geq (2+P1)$.

42. The acceleration method according to claim 40, further comprising:
determining each first offset according to the result of comparing the first bitmap with the output bitmap and adding a first base address and each first offset to generate each first access address; and
when the bitwise logical AND operation is performed between the first bitmap and the second bitmap, determining each second offset according to the result of comparing the second bitmap with the output bitmap and adding a second base address and each second offset to generate each second access address;
wherein the M1 non-zero first elements are sequentially stored from the first base address in the first storage device, and the M2 non-zero second elements are sequentially stored from the second base address in the second storage device.

43. The acceleration method according to claim 40, further comprising:
converting one of the first NZP and raw data of the first matrix into the first bitmap and the first payload before the step of sequentially storing the first payload; and
converting one of the second NZP and raw data of the second matrix into the second bitmap, the second payload, the P1 bitmaps and the P1 different group values before the step of sequentially storing the second payload.

44. The acceleration method according to claim 35, wherein a first non-zero packet (NZP) associated with a first matrix comprises the first bitmap and the first payload, and a second NZP associated with a second matrix comprises a third bitmap and a third payload, wherein the second matrix comprises M5 second elements that are divided into a zero group and P1 same-value groups, and wherein the P1 same-value groups are associated with the P1 bitmaps and the P1 different group values.

45. The acceleration method according to claim 44, wherein each bit in the first bitmap indicates whether a corresponding first element in the first matrix is equal to zero, and every P3 bit in the third bitmap indicates which group a corresponding second element belongs to, where $2^{P3} \geq (1+P1)$.

46. The acceleration method according to claim 44, further comprising:
determining each first offset according to the result of comparing the first bitmap with the output bitmap and adding a first base address and each first offset to generate each first access address;
wherein the M1 non-zero first elements are sequentially stored from the first base address in the first storage device.

47. The acceleration method according to claim 44, further comprising:
converting one of the first NZP and raw data of the first matrix into the first bitmap and the first payload before the step of sequentially storing the first payload; and
converting one of the second NZP and raw data of the second matrix into the P1 bitmaps and the P1 different group values.

* * * * *